(12) United States Patent
Ikeda et al.

(10) Patent No.: US 11,327,374 B2
(45) Date of Patent: May 10, 2022

(54) DISPLAY DEVICE

(71) Applicant: Japan Display Inc., Tokyo (JP)

(72) Inventors: Masataka Ikeda, Tokyo (JP); Gen Koide, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/123,434

(22) Filed: Dec. 16, 2020

(65) Prior Publication Data

US 2021/0191206 A1  Jun. 24, 2021

(30) Foreign Application Priority Data

Dec. 19, 2019 (JP) .............................. JP2019-229280

(51) Int. Cl.
  *G02F 1/1345* (2006.01)
  *G02F 1/1362* (2006.01)

(52) U.S. Cl.
  CPC .... *G02F 1/13454* (2013.01); *G02F 1/136286* (2013.01)

(58) Field of Classification Search
  CPC combination set(s) only.
  See application file for complete search history.

(56) References Cited

U.S. PATENT DOCUMENTS

2015/0028339 A1\* 1/2015 Sogabe ............... H01L 27/1222
  257/71
2018/0231853 A1\* 8/2018 Yamamoto ............ G06F 3/0446

FOREIGN PATENT DOCUMENTS

JP  2019-120902 A  7/2019

\* cited by examiner

*Primary Examiner* — Dung T Nguyen
(74) *Attorney, Agent, or Firm* — Oblon, McClelland, Maier & Neustadt, L.L.P.

(57) ABSTRACT

A display device includes a first direction, a plurality of pixels arranged in a second direction intersecting the first direction, at least one scanning signal line connected to the plurality of pixels, a scanning signal line driving circuit connected to the scanning line, the scanning signal line driving circuit includes a switch for outputting a signal to the scanning signal line, a first power supply line for providing a first voltage to the switch, a second power supply line for providing a second voltage smaller than the first voltage to the switch, and the switch is provided between the first power supply line and the second power supply line, a line width of the second power supply line is 4 times the line width of the first power supply line or more and 40 times the line width of the first power supply line or less.

11 Claims, 27 Drawing Sheets

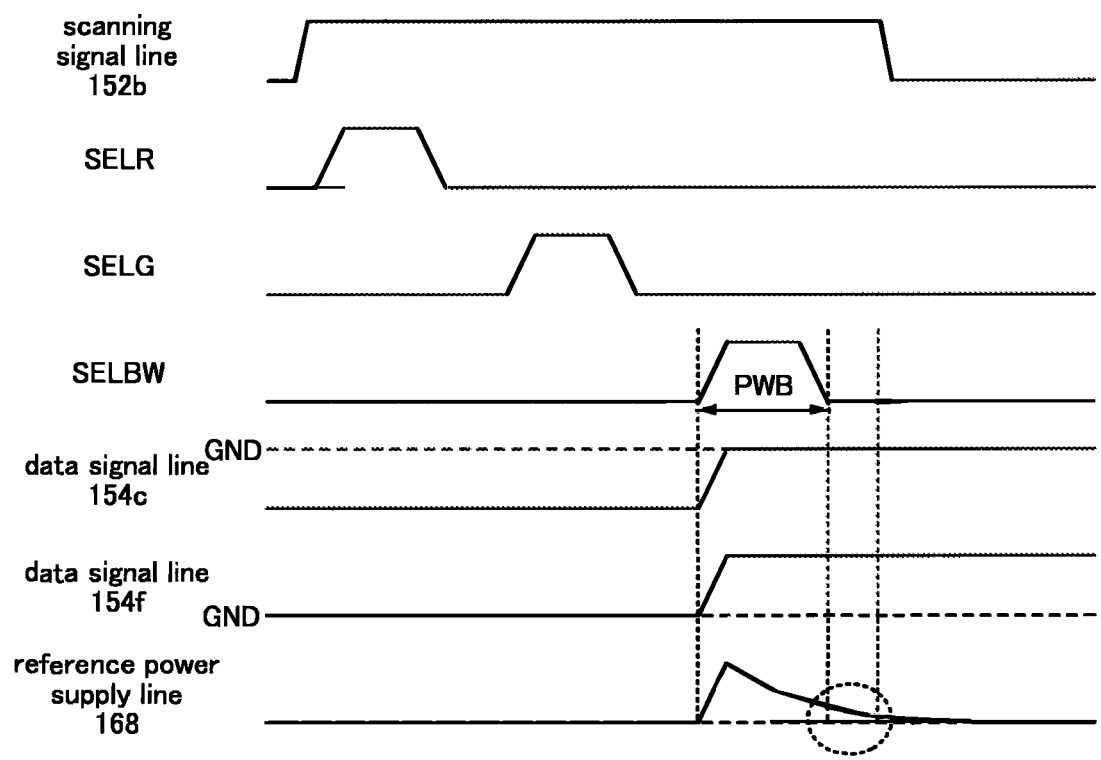

DISPLAY DEVICE

CROSS-REFERENCE TO RELATED APPLICATIONS

This application is based upon and claims the benefit of priority from the prior Japanese Patent Application No. 2019-229280, filed on Dec. 19, 2019, the entire contents of which are incorporated herein by reference.

FIELD

An embodiment of the present invention relates to a display device.

BACKGROUND

In recent years, the development of a display device represented by a liquid crystal display device and an organic electroluminescent display device is progressing in order to suppress deterioration of display quality. As one of method for suppressing the deterioration of the display quality, for example, there is a method for improving the color reproducibility. Generally, a display of the display device consists of several pixels. One pixel is composed of three sub-pixels. The three sub-pixels have a display element corresponding to the three primary colors of light-red, green, and blue. Here, the three sub-pixels include R pixel, G pixel and B pixel. R pixel is a sub-pixel having a display element corresponding to red, G pixel is a sub-pixel having a display element corresponding to green, and B pixel is a sub-pixel having a display element corresponding to blue. In the display device, four sub-pixels are configured by adding a sub-pixel (W pixel) having a display element corresponding to white to the three sub-pixels. As a result, the color reproducibility of the display device is improved.

For example, Japanese laid-open patent publication No. 2019-120902 discloses a technique for suppressing a decrease in the display quality in the display device having four sub-pixels of R pixel, G pixel, B pixel, and W pixel.

SUMMARY

A display device according to an embodiment of the present invention includes a first direction; a plurality of pixels arranged in a second direction intersecting the first direction; at least one scanning signal line connected to the plurality of pixels; and a scanning signal line; and a scanning signal line driving circuit connected to scanning signal line driving circuit, the switch outputting a signal to scanning signal line; a first power supply line supplying a first voltage to the switch; and a second power supply line supplying a second voltage smaller than the first voltage to the switch, wherein the switch is provided between the first power supply line and the second power supply line, the line width of power supply line being greater than four times the line width of the enable signal line and not more than 40 times the line width.

BRIEF DESCRIPTION OF DRAWINGS

FIG. 4B is a diagram showing an exemplary timing chart of a conventional display device;

DESCRIPTION OF EMBODIMENTS

Figure 1:
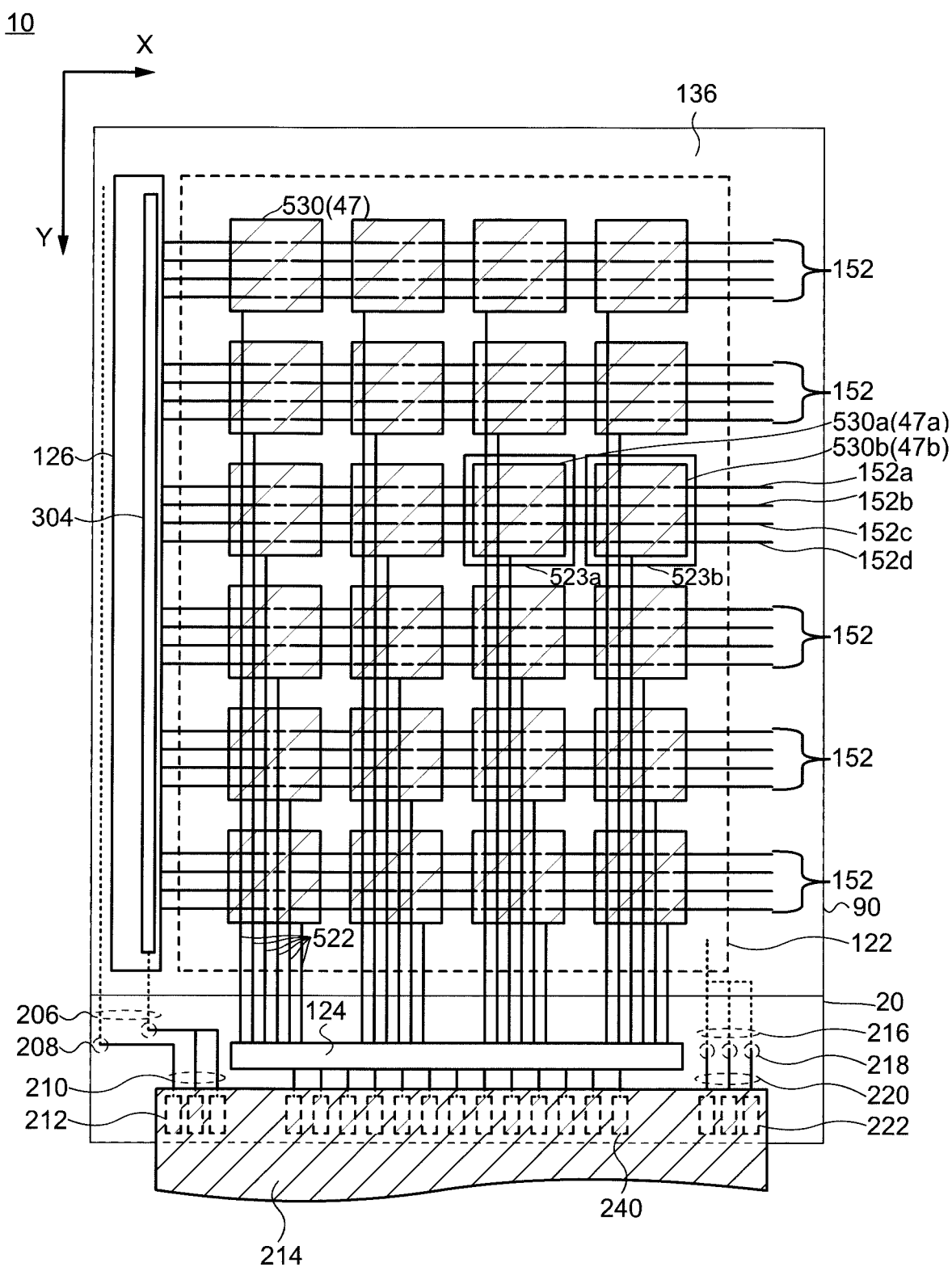
FIG. 1 is a schematic plan view showing a configuration of a display device according to an embodiment of the present invention.

The embodiments of the present invention are explained below while referring to the drawings and the like. However, the present invention can be carried out in many different modes and should not be interpreted as being limited to the description of the following embodiments. In addition, although the structure of each part may be schematically represented for configurations as compared with actual embodiments, such explanations are merely an example and do not limit the interpretation of the present invention. Furthermore, in the present specification and each drawing, elements similar to those described above with reference to a previously mentioned figure are denoted with the same reference numerals (or reference numerals followed by numerals such as a and b), and a detailed description thereof may be omitted as appropriate. The letters added with "first" and "second" with respect to each element are convenient signs used to distinguish each element and have no further meaning unless otherwise stated.

If a driving method of a display device having the four sub-pixels of R, G, B, and W pixels is a column-inverted driving method, a crosstalk may occur at the display device. When the driving method of the display device having the four sub-pixels of R, G, B, and W pixels is the column-inverted driving method, there was a possibility that a voltage applied to each pixel of the display device would be lowered. Consequently, there is a possibility that the display quality of the display device having four sub-pixels of R, G, B, and W pixels is reduced.

In view of the above, an object of the present invention is to provide a display device having a configuration that suppresses a decrease in the display quality when the driving method of the display device having the four sub-pixels is column-inverted.

1. First Embodiment

<1-1. Configuration of Display Device 10>

FIG. 1 is a schematic plan view showing a configuration of a display device 10 according to an embodiment of the present invention. A configuration of the display device 10 according to an embodiment of the present invention shown in FIG. 1 is an example and is not limited to the configuration shown in FIG. 1. In one embodiment, the display device 10 is, for example, a liquid crystal display device. The display device 10 includes, for example, a function of a touch panel having a touch electrode.

The display device 10 includes a plurality of common electrodes 530 (a fourth conductive film 47) arranged in a matrix in the X direction (row direction) and the Y direction (column direction) intersecting the X direction in a top view, a wiring 522 electrically connected to the fourth conductive film 47, a first substrate 20, a second substrate 90, a display unit 122, a peripheral part 136, a video signal line driving circuit 124, a scanning signal line driving circuit 126, and a wiring substrate 214. The display device 10 may have the scanning signal line driving circuit 126 in left and right sides of display unit 122 in a top view. The first substrate is also referred to as an array substrate or a TFT substrate. The second substrate 90 is also referred to as a counter substrate or a color filtering substrate.

The display unit 122 has a plurality of pixels PX. The first substrate 20 is bonded to the second substrate 90 at a sealing portion. The display unit 122 is surrounded by the sealing portion provided in the peripheral part 136. The video signal line driving circuit 124 and the scanning signal line driving circuit 126 are provided in the peripheral part 136. The video signal line driving circuit 124, for example, is provided parallel or substantially parallel to the Y-direction. The video signal line driving circuit 124, for example, is provided at a position adjacent to each other. The scanning signal line driving circuit 126, for example, is provided parallel or substantially parallel to the X-direction. The video signal line driving circuit 124 and the scanning signal line driving circuit 126 control the driving of the pixel.

In the exemplary embodiment shown in FIG. 1, a plurality of pixels PX, and the scanning signal line driving circuit 126 as a built-in circuit is provided on the first substrate 20. The video signal line driving circuit 124 is an IC chip and the video signal line driving circuit 124 is provided on the first substrate 20. The configuration of the video signal line driving circuit 124 is not limited to the exemplary configuration shown in FIG. 1. For example, the video signal line driving circuit 124, such as the IC chip, may be provided on the wiring substrate 214, such as a flexible printed circuit (Flexible Printed Circuit, FPC) substrate. A portion of the circuit of the video signal line driving circuit 124 may be formed on a substrate different from the first substrate 20 and the substrate different from the first substrate 20 may be provided over the first substrate 20 or the wiring substrate 214.

The driving circuit included in the video signal line driving circuit 124 or a portion of the driving circuit included in the video signal line driving circuit 124, which is the IC chip, may be formed directly on the first substrate 20 as a built-in circuit, similar to the scanning signal line driving circuit 126. In this case, the video signal line driving circuit 124 is formed between the IC chip and the display unit 122. The IC chip may be mounted to the first substrate 20 between the wiring substrate 214 and the video signal line driving circuit 124, and the IC chip may be mounted to the wiring substrate 214. The wiring 522 is not intended to be connected to the video signal line driving circuit 124 and may be constructed to be connected to the IC chip.

As described above, the video signal line driving circuit and the IC chip may be formed individually, and the video signal line driving circuit 124 may simply be replaced with a driver IC chip 124 that does not include the video signal line driving circuit as the built-in circuit.

A display element such as a liquid crystal element provided in the pixel, and various semiconductor elements for controlling them are formed on the first substrate 20.

The display device 10 includes a first wiring 206, an opening 208, a first terminal wiring 210, a first terminal 212, a second wiring 216, an opening 218, a second terminal wiring 220, and a second terminal 222. These are also provided on the first substrate 20.

Although described later in more detail, a power supply line 304 provided on the scanning signal line driving circuit 126 (FIG. 6) is electrically connected to the first wiring 206 extending from the peripheral part 136. Further, as will be described in detail later, in the display device 10 according to an embodiment of the present invention, the line width of the power supply line 304 provided in the scanning signal line driving circuit 126 is larger than the line width of a power supply line of the conventional display device. In the display device 10 according to an embodiment of the present invention, the power source line 304 provided in the scanning signal line driving circuit 126 is configured by stacking a plurality of wiring layers. Consequently, the resistance value of the power supply line 304 can be made smaller than the resistance value of the conventional power supply line. A falling time of a signal supplied to the scanning signal line depends on a resistance value of the power supply line 304. As a result, the falling time of the signal supplied to the respective scanning signal line 152, 152a to 152d becomes faster when the resistance value of the power supply line 304 becomes smaller than the resistance value of the conventional power supply line.

For example, the common electrode 530 (the fourth conductive film 47) may be electrically connected to the wiring 522, all of the wiring 522 electrically connected to the common electrode 530 (the fourth conductive film 47), and electrically connected to the first wiring 206 extending from the peripheral part 136. A signal or a power source for driving the pixel may be provided to the pixel from an external device (not shown) and the peripheral part 136 via the first terminal 212, the scanning signal line driving circuit 126. The signal or the power source for driving the pixel may be provided to the pixel from the external device (not shown) and the peripheral part 136 via a terminal electrode 240, the video signal line driving circuit 124 or the driver IC chip 124. For example, the first wiring 206 extends in the peripheral part 136 and is electrically connected to the first terminal wiring 210 via the opening 208. The first terminal wiring 210 is exposed near an end portion of the terminal electrode 240 of the display device 10 is provided to form the first terminal 212. The first terminal 212 is connected to the wiring substrate 214. The first terminal 212 may be a terminal of the driver IC chip 124.

For example, the common electrode 530 (the fourth conductive film 47) may be electrically connected to the wiring 522, all of the wiring 522 electrically connected to the common electrode 530 (the fourth conductive film 47), and electrically connected to the second wiring 216 extending from the peripheral part 136. The signal or the power source for driving the pixel may be provided to the pixel via an external device (not shown) and the second wiring 216 extending from the peripheral part 136. The signal or power source for driving the pixel may be provided to the pixel from the external device (not shown) and the peripheral part 136 via the second terminal 222, the scanning signal line driving circuit 126. The second wiring 216 extends in the peripheral part 136 and is electrically connected to the second terminal wiring 220 via the opening 218. The second terminal wiring 220 is exposed near an end portion of the terminal electrode 240 of the display device 10 is provided to form the second terminal 222. The second terminal 222 is connected to the wiring substrate 214.

When the display device 10 displays an image, the common electrode 530 functions as a common electrode. When the display device 10 functions as a touch panel, the common electrode 530 (the fourth conductive film 47) functions as a touch electrode.

The first terminal 212, the second terminal 222, or the terminal electrode 240 may be formed so as to line up along one side of the display device 10. Thus, the single wiring substrate 214 may be used to provide a voltage or a signal for driving the pixel to each of the display unit 122, the video signal line driving circuit 124, and the scanning signal line driving circuit 126. Signals associated with touch detection may be received from the common electrode 530 (the fourth conductive film 47) via the wiring 522 and signals associated with touch detection may be provided to the common electrode 530 (the fourth conductive film 47).

Figure 2:
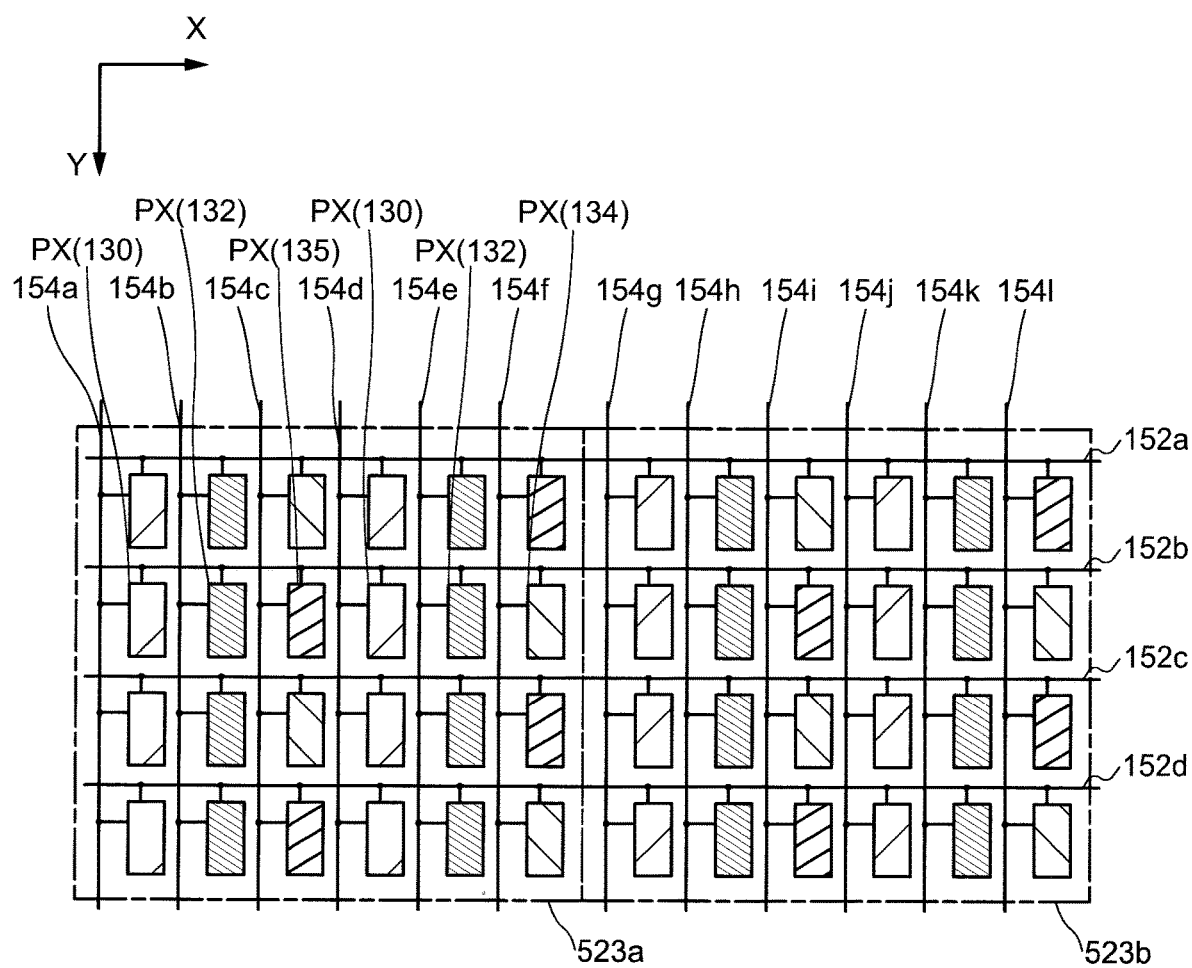
FIG. 2 is a schematic plan view showing a configuration of a display device according to an embodiment of the present invention.

The display unit 122 has the plurality of pixels PX. The plurality of pixels PX are arranged in a matrix. FIG. 2 is a schematic plan view showing a configuration of a first region 523a and a second region 523b of the display unit 122 according to an embodiment of the present invention. The first region 523a is a region including a common electrode 530a (a fourth conductive film 47a), and the second region 523b is a region including a common electrode 530b (a fourth conductive film 47b). As shown in FIG. 2, the plurality of pixels PX are arranged in a matrix in the first region 523a and the second region 523b. Each of the plurality of pixels PX, for example, corresponds to four sub-pixels including sub-pixel 130, sub-pixel 132, sub-pixel 134, and sub-pixel 135. A pixel circuit PXA is the smallest unit generating a part of the image reproduced by the display unit 122. Each sub-pixel is equipped with one display element. In the example shown in FIG. 1, the display element is the liquid crystal element. The color corresponding to the sub-pixel is determined by the characteristics of the liquid crystal element or the color filter provided on the sub-pixel. The configuration shown in FIG. 2 is an example, and the configuration of the pixel PX according to an embodiment of the present invention is not limited to the configuration shown in FIG. 2.

The sub-pixel 130, the sub-pixel 132, the sub-pixel 134, and the sub-pixel 135 are configured to give different colors to each other. In one embodiment, the sub-pixel 130 includes a color filter layer that emits a red color, the sub-pixel 132 includes a color filter layer that emits a green color, the sub-pixel 134 includes a color filter layer that emits a blue color, and the sub-pixel 135 includes a color filter layer that emits a white color. Any voltages or currents are supplied to each of the four sub-pixels, and the display device 10 can display images.

The video signal line driving circuit 124 is electrically connected to the wiring 522. The video signal line driving circuit 124 is connected to the wiring 522 according to the touch detection. The video signal line driving circuit 124 has the function of a touch detection circuit. The wiring 522 may not be connected to the video signal line driving circuit 124 as the internal circuit and the wiring 522 may be connected to the driver IC chip 124. In this case, the driver IC chip 124 has a function of the touch detection circuit. The video signal line driving circuit 124 is connected to one end of a plurality of video signal lines 154a to 154l (not shown). The plurality of video signal lines 154 is connected to the plurality of pixels PX arranged in the Y-direction. As shown in FIG. 2, for example, the video signal line 154a, the video signal line 154d, the video signal line 154g and the video signal line 154j are connected to a plurality of sub-pixels 130. A video signal line 154b, the video signal line 154e, the video signal line 154h and the video signal line 154k are connected to a plurality of sub-pixels 132. The video signal line 154c, the video signal line 154f, the video signal line 154i and the video signal line 154l are connected to a plurality of sub-pixels 134 and 135.

The scanning signal line driving circuit 126 is connected to one end of a plurality of scanning signal lines 152a, 152b, 152c, and 152d. As shown in FIG. 2, for example, a plurality of scanning signal line 152 is connected to the plurality of pixels PX arranged in the X-direction. Each of the scanning signal line 152a, the scanning signal line 152c, the scanning signal line 152e, and the scanning signal line 152g (not shown) is connected to a plurality of sub-pixels arranged in the order of the sub-pixel 130, the sub-pixel 132, the sub-pixel 134, the sub-pixel 130, the sub-pixel 132, and the sub-pixel 135, along the X-direction. Each of the scanning signal line 152b, the scanning signal line 152d, the scanning signal line 152f, and the scanning signal line 152h (not shown) is connected to the plurality of sub-pixels arranged in the order of the sub-pixel 130, the sub-pixel 132, the sub-pixel 135, the sub-pixel 130, the sub-pixel 132, and the sub-pixel 134 along the X-direction.

<1-2. Pixel Configuration>

Figure 3:
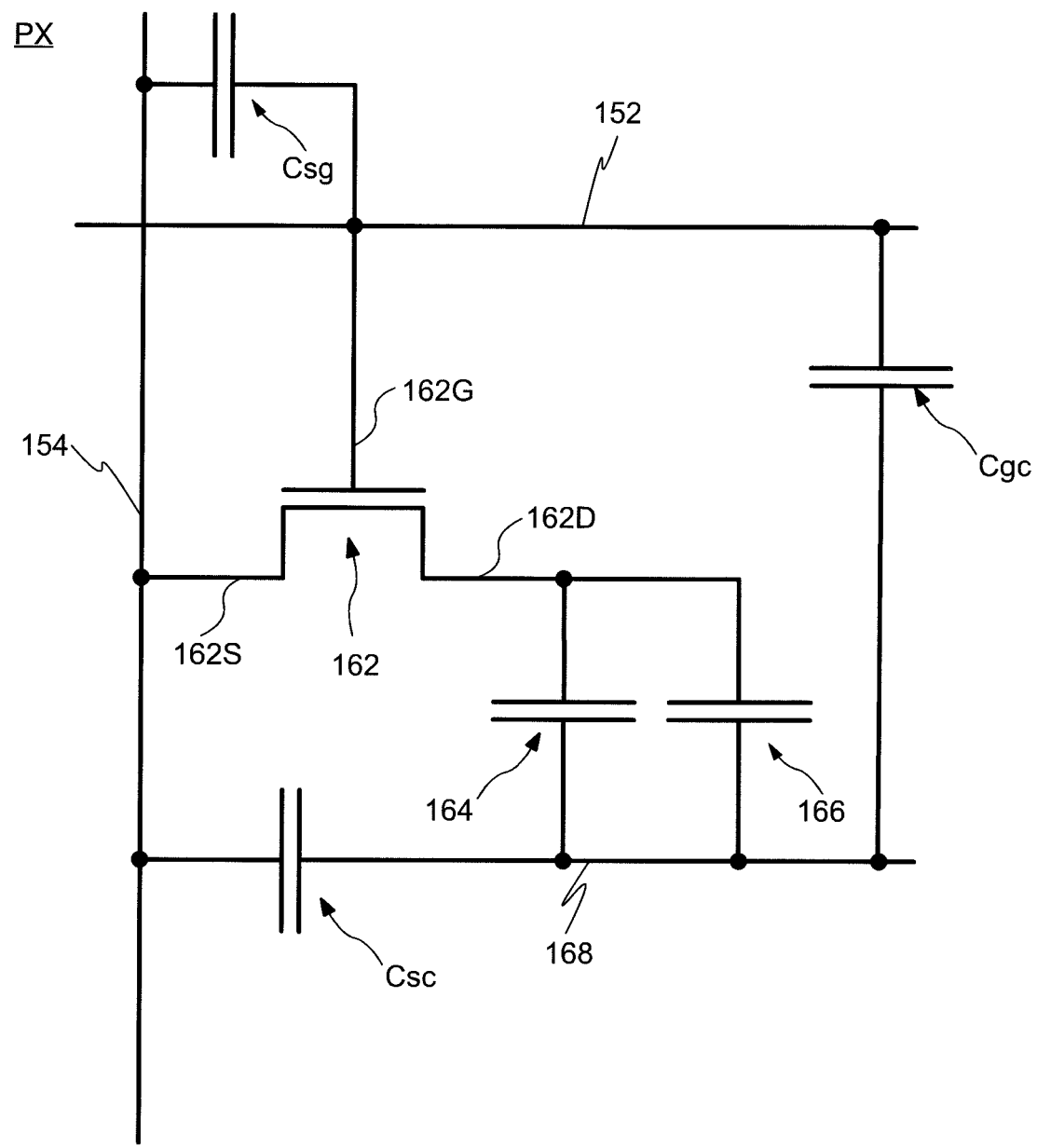
FIG. 3 is an equivalent circuit diagram showing a configuration of a pixel according to an embodiment of the present invention.

FIG. 3 is a circuit diagram showing an equivalent circuit showing the configuration of the pixel PX according to an embodiment of the present invention and the capacitance generated in the pixel. Description of the same or similar components as those in FIG. 1 is omitted here. The circuit configuration of the pixel PX shown in FIG. 3 is only an example, and the circuit configuration according to an embodiment of the present invention is not limited to the circuit configuration shown here.

As shown in FIG. 3, the pixel PX includes elements such as a transistor 162, a storage capacitor 164 and a liquid crystal element 166. The transistor 162 has a gate electrode 162G, a source electrode 162S, and a drain electrode 162D. The gate electrode 162G is connected to the scanning signal line 152. The source electrode 162S is connected to the video signal line 154. The drain electrode is connected to the pixel electrode. In the circuit diagram of FIG. 3, the drain electrode 162D is connected to one end of the storage capacitor 164 and one end of the liquid crystal element 166. The other end of the storage capacitor 164 and the other end of the liquid crystal element 166 are connected to, for example, a reference power supply line 168.

The reference power supply line 168 is provided in common to the plurality of pixels PX. That is, the reference power supply line 168 is electrically connected to the plurality of pixels PX. The reference power supply line 168 is referred to, for example, as a common power supply line. The reference power supply line 168, for example, a constant voltage is supplied from a plurality of first terminals 212. The constant voltage is, for example, a 0 V or a common voltage. The reference power supply line 168 is shared by each pixel. A common constant voltage is supplied to each pixel. One end of the storage capacitor 164 connected to the reference power supply line 168 or one end of the liquid crystal element 166 is referred to as the common electrode. Voltages applied to the source electrode 162S and the drain electrode 162D may interchange the functions of the respective electrodes as the source and the drains. The reference power supply line 168 is provided using, for example, a second conductive film, or a third conductive film. The reference power supply line 168, for example, may be provided using the third conductive film, may be the wiring 522 provided using the third conductive film. The common electrode 530 (the fourth conductive film 47) is electrically connected to the third conductive film via an opening for opening an organic film 49 (FIG. 9) (not shown). The reference power supply line 168 is the wiring 522 provided using the third conductive film, is connected to the common electrode 530 (the fourth conductive film 47).

<1-3. Driving Method of Display Device 10>

Figure 4A:
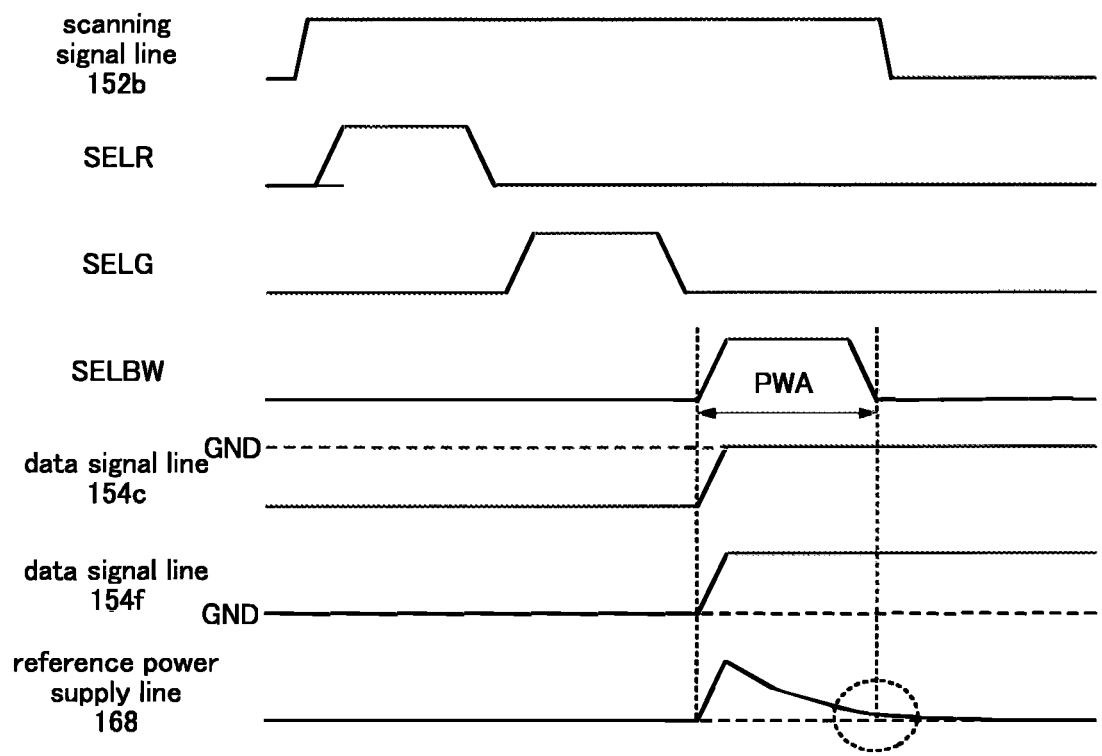
FIG. 4A is a diagram showing an exemplary timing chart of a conventional display device.
Figure 5:
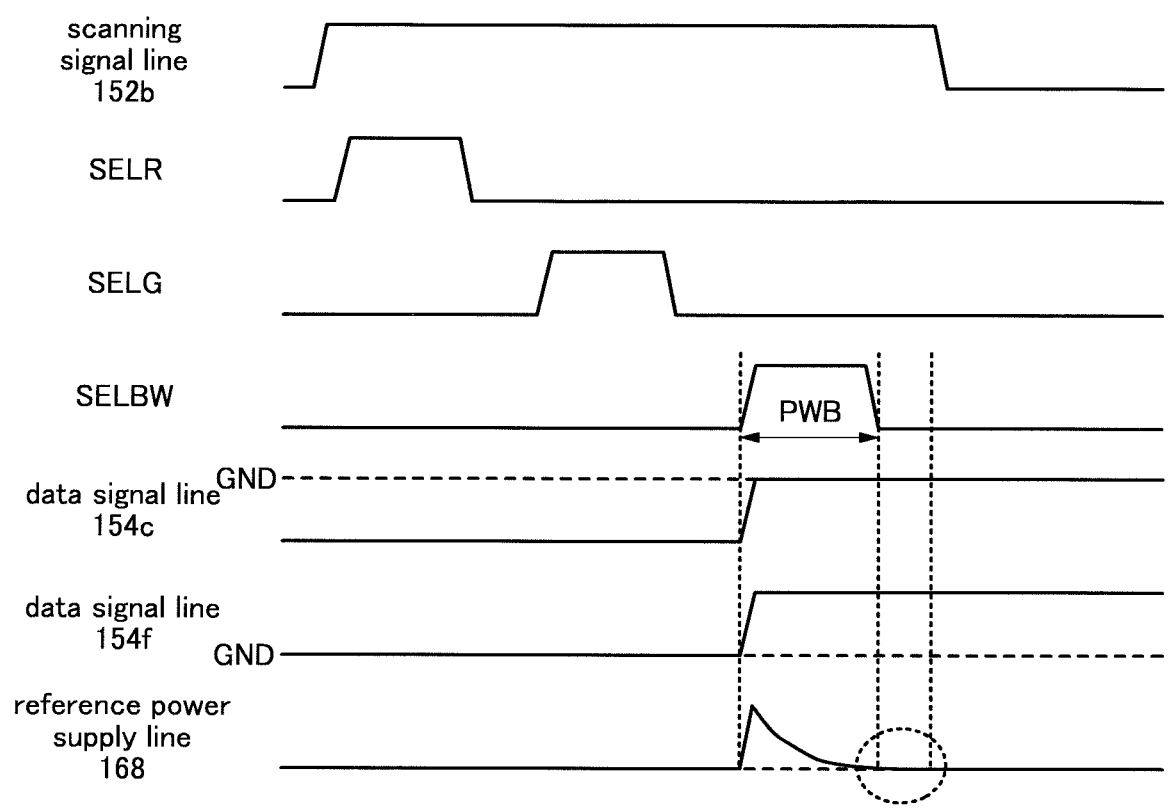
FIG. 5 is a diagram showing an exemplary timing chart of a display device according to an embodiment of the present invention.

An exemplary driving method of the display device 10 and a conventional driving method of the display device according to an embodiment of the present invention will be described referring to FIGS. 2 to 5. FIG. 4A and FIG. 4B are diagrams showing an exemplary timing chart of the conventional display device. FIG. 5 is a timing chart of the display device 10 according to an embodiment of the present invention. The timing charts shown in FIGS. 4A, 4B, and 5 are only examples, and are not limited to the examples shown in FIGS. 4A, 4B, and 5. The same or similar configurations as those of FIGS. 1 to 3 will not be described here.

The driving method according to an embodiment of the present invention is based on column inversion driving. For example, for an image displayed in the n−1th cycle, the video signal line 154a, the video signal line 154c, the video signal line 154e, the video signal line 154g, the video signal line 154i, and the video signal line 154k are supplied with an image signal corresponding to a negative voltage with respect to the common voltage, and the video signal line 154b, the video signal line 154d, the video signal line 154f, the video signal line 154h, the video signal line 154j, and the video signal line 154l are supplied with an image signal corresponding to a positive voltage with respect to the common voltage. Subsequently, for an image displayed in the nth cycle, the video signal line 154a, the video signal line 154c, the video signal line 154e, the video signal line 154g, the video signal line 154i, and the video signal line 154k are supplied with an image signal corresponding to a positive voltage with respect to the common voltage, and the video signal line 154b, the video signal line 154d, the video signal line 154f, the video signal line 154h, the video signal line 154j, and the video signal line 154l are supplied with an image signal corresponding to a negative voltage with respect to the common voltage. Here, in the plurality of sub-pixels included in the first region 523a, the sub-pixels 134 emitting blue are supplied with voltages emitting blue, the other sub-pixels are supplied with GND, and the other sub-pixels display black. It is assumed that the plurality of sub-pixels included in the display unit 122 other than the first region 523a are supplied with voltages for displaying gray-scale images. That is, a voltage for displaying a gray-scale image is supplied to the second region 523b. In the following explanation, the display unit 122 other than the first region 523a will be referred to as a background portion. For the gray-scale image displayed in the second region 523b, the voltage supplied to the plurality of sub-pixels of the second region 523b, for example, referred to as a voltage for displaying a half-tone image. For example, the half-tone image is an intermediate color image of a white image and a black image, or an approximately intermediate color image.

As shown in FIG. 4A, for example, a pulse signal is supplied to the scanning signal line 152b, SELR, SELG, and each of SELBW. When the scanning signal line 152b is selected and the SELR selects the video signal line 154a, the video signal line 154d, the video signal line 154g, and the video signal line 154j, the plurality of sub-pixels 130 connected to the video signal line 154a, the video signal line 154d, the video signal line 154g, or the video signal line 154j are supplied with the video signals corresponding to the sub-pixels. When the scanning signal line 152b is selected and the SELG selects the video signal line 154b, the video signal line 154e, the video signal line 154h, and the video signal line 154k, the plurality of sub-pixels 130 connected to the video signal line 154b, the video signal line 154e, the video signal line 154h, and the video signal line 154k are supplied with the video signal corresponding to each of the plurality of sub-pixels 130. When the scanning signal line 152b is selected and the SELBW selects the video signal line 154c, the video signal line 154f, the video signal line 154i, and the video signal line 154l, the plurality of sub-pixels 134 and 135 connected to the video signal line 154c, the video signal line 154f, the video signal line 154i, or the video signal line 154l are supplied with the video signals corresponding to each of the plurality of sub-pixels 134 and 135.

For example, the video signal line 154c supplies the blue video signal corresponding to the negative voltage supplied to the sub-pixel 134 selected by the scanning signal line 152a of the previous row and supplies a video signal corresponding to the GND voltage supplied to the sub-pixel 135 selected by the scanning signal line 152b of the row. The video signal line 154f supplies the video signal corresponding to the GND voltage supplied to the sub-pixel 135 selected by the scanning signal line 152a of the previous row and supplies the blue video signal corresponding to the positive voltage supplied to the sub-pixel 134 selected by the scanning signal line 152b of the row. The video signal line 154i supplies a half-tone video signal corresponding to the half-tone voltage supplied to the sub-pixel 134 selected by the scanning signal line 152a of the previous row and supplies the half-tone video signal corresponding to the half-tone voltage supplied to the sub-pixel 135 selected by the scanning signal line 152b of the row. The video signal line 154l supplies the half-tone video signal corresponding to the half-tone voltage supplied to the sub-pixel 135 selected by the scanning signal line 152a of the previous row and supplies the half-tone video signal corresponding to the half-tone voltage supplied to the sub-pixel 134 selected by the scanning signal line 152b of the row.

Referring to FIG. 3, there is a parasitic capacitance Csc between the video signal line 154 and the reference power supply line 168, there is a parasitic capacitance Csg between the video signal line 154 and the scanning signal line 152, there is also a parasitic capacitance Cgc between the scanning signal line 152 and the reference power supply line 168.

Returning to FIG. 4A, the description will be continued. Initially, the scanning signal line 152b is selected and the SELBW is supplied with a signal with a pulse-width PWA. The video signal line 154c is supplied with the video signal corresponding to the voltage of GND from the negative voltage. The sub-pixel 135 emitting the white color selected by the scanning signal line 152b is supplied with a video signal corresponding to the voltage of GND. The video signal line 154f is supplied with the blue video signal corresponding to a positive voltage from the voltage of GND. The sub-pixel 134 emitting blue selected by the scanning signal line 152b is supplied with the blue video signal corresponding to a positive voltage. Both the voltage supplied to the video signal line 154c and the voltage supplied to the video signal line 154f increase. Therefore, the potential of the video signal line 154c and the potential of the video signal line 154f increase. Consequently, the potential of the common electrode 530 (the fourth conductive film 47) and the potential of the reference power supply line 168 (the wiring 522) is increased by capacitive coupling of the video signal line 154 and the reference power supply line 168 accompanying the parasitic capacitance Csc. Furthermore, as described referring to FIGS. 1 to 3, the common electrode 530 (the fourth conductive film 47) and the reference power supply line 168 (the wiring 522) are all electrically connected. Consequently, the potential of the common electrode 530 (the fourth conductive film 47) of the background portion and the potential of the reference power supply line 168 (the wiring 522) also increase. On the other hand, when a signal that changes from low (Low) to high (High) is supplied to the scanning signal line 152b and the scanning signal line 152b is selected, the low (Low) is supplied to the scanning signal line 152, the scanning signal line 152a, the scanning signal line 152c, the scanning signal line 152d, the scanning signal line 152e (not shown), the scanning signal line 152f (not shown), and the scanning signal line 152h (not shown) other than the scanning signal line 152b. The scanning signal line 152a, the scanning signal line 152c, the scanning signal line 152d, the scanning signal line 152e (not shown), the scanning signal line 152f (not shown), the scanning signal line 152g (not shown), and the scanning signal line 152h (not shown) are not selected.

Although not shown, similarly to the video signal line 154c and the video signal line 154f, when the scanning signal line 152b is selected and the signal with the pulse-width PWA is supplied to the SELBW, a half-tone image signal corresponding to a negative half-tone voltage is supplied to the video signal line 154i, and the sub-pixel 135 emitting white selected by the scanning signal line 152b is supplied with a half-tone image signal corresponding to a negative half-tone voltage. Similarly, a half-tone video signal corresponding to a positive half-tone voltage is supplied to the video signal line 154l, and the sub-pixel 134 emitting blue selected by the scanning signal line 152b is supplied with the half-tone video signal corresponding to the positive half-tone voltage. Here, the potential of the video signal line 154c and the potential of the video signal line 154f increase. Consequently, the potential of all the scanning signal line 152 is increased by the capacitive coupling of the video signal line 154 and the scanning signal line 152 accompanying the parasitic capacitance Csg. The scanning signal line 152 extends to the second region 523b which is the background portion and the side opposite to the side where the second region 523b is provided relative to the first region 523a. Therefore, when the potential of the scanning signal line 152 is increased, the potential of the common electrode 530 of the background portion (the conductive film 47) and the potential of the reference power supply line 168 (the wiring 522) also increase by the capacitive coupling of the reference power supply line 152 and the reference power supply line 168 of the background portion accompanying the parasitic capacitance Cgc.

As shown in FIG. 4A, the increased potential of the reference power supply line 168 decreases with time. Then, when the signal (low) of the pulse-width PWA is supplied to the SELBW, the potential of the reference power supply line 168 is generally converged to the original potential.

FIG. 4B shows a timing chart when a signal of a narrower pulse-width PWB than the pulse-width PWA is supplied to the SELBW. The narrow pulse-width supplied to the SELBW means that the display device is driven at high speed compared to the wide pulse-width supplied to the SELBW. As shown in FIG. 4B, a signal changing from low (Lo) to high (High) is supplied to the scanning signal line 152b, the scanning signal line 152b is selected, the signal of the pulse-width PWB (high) is supplied to the SELBW. As a result, same as described in FIG. 4A, the potentials of the video signal line 154c and the video signal line 154f increase, and the potentials of the common electrode 530 (the fourth conductive film 47) and the reference power supply line 168 (the wiring 522) increase due to the capacitive coupling of the video signal line 154 and the reference power supply line 168 accompanying the parasitic capacitance Csc. When the potential of the scanning signal line 152 is increased, the potentials of the common electrode 530 of the background portion (the fourth conductive film 47) and the reference power supply line 168 (the wiring 522) also increase by the capacitive coupling between the reference power supply line 152 and the reference power supply line 168 of the background portion accompanying the parasitic capacitance Cgc.

In FIG. 4B, since the pulse-width supplied to the SELBW is narrow, even if the signal of the pulse-width PWB (low) is supplied to the SELBW, the potential of the reference power supply line 168 is higher than the original potential. When the potential of the reference power supply line 168 becomes higher than the original potential, the sub-pixel 135 emitting white and connected to both the video signal line 154i and the scanning signal line 152b is displayed brighter than the image of the half-tone originally displayed, and the sub-pixel 134 emitting blue and connected to both the video signal line 154*l* and the scanning signal line 152*b* is displayed darker than the image of the half-tone originally displayed. Therefore, as the potential of the reference power supply line 168 becomes higher than the original potential, the second region 523*b* and the gray image in the region opposite to side where the second region 523*b* is provided relative to the first region 523*a* are displayed brightly. As the potential of the reference power supply line 168 becomes higher than the original potential, the crosstalk occurs in the display device and the display quality of the display device is reduced.

One embodiment in the present invention focus on the power supply line 304 supplying a voltage to the unselected scanning signal line 152. The power supply line 304 is electrically connected to the unselected scanning signal line 152 to supply a voltage to the unselected scanning signal line 152. Consequently, the potential of the power supply line 304 increases by the capacitive coupling of the video signal line 154 and the unselected scanning signal line 152 accompanying the parasitic capacitance Csg. That is, due to the capacitive coupling of the unselected scanning signal line 152 and the reference power supply line 168, the power supply line 304 and the reference power supply line 168 are affected by each other. Due to the effects of the parasitic capacitances Csg and Cgc, the potential increased in the power supply line 304 quickly converges in the vicinity of the original potential. As a result, the potential of the reference power supply line 168 quickly converges to the vicinity of the original potential. The fast convergence of the potential increased in the power supply line 304 to the vicinity of the original potential means that the falling time of the power supply line 304 is faster or a time constant of the power supply line 304 is smaller.

As will be described in detail later, in the display device 10 according to an embodiment of the present invention, the line width of the power supply line 304 provided in the scanning signal line driving circuit 126 is larger than the line width of the power supply line of the conventional display device. Alternatively, in the display device 10 according to an embodiment of the present invention, the power supply line 304 provided in the scanning signal line driving circuit 126 is configured by stacking a plurality of wiring layers. With the above configuration, in the display device 10 according to an embodiment of the present invention, resistance value of the power supply line 304 provided in the scanning signal line driving circuit 126 can be made smaller than resistance value of the power supply line in the conventional display device. In the display device 10 according to an embodiment of the present invention, it is possible to reduce the resistance of the power supply line 304, it is possible to reduce the time constant of the power supply line 304. Consequently, as shown in FIG. 5, the potential of the reference power supply line 168 converges quickly to near the original potential. That is, in the display device 10 according to an embodiment of the present invention, the resistance value of the power supply line 304 is smaller than that of the conventional one. Therefore, the increase in the potential of the reference power supply line 168 is suppressed. As a result, the occurrence of crosstalk with the increase in the potential of the reference power supply line 168 is suppressed, it is possible to suppress the decrease in the display quality of the display device.

<1-4. Configuration of Scanning Signal Line Driving Circuit 126>

Figure 6:
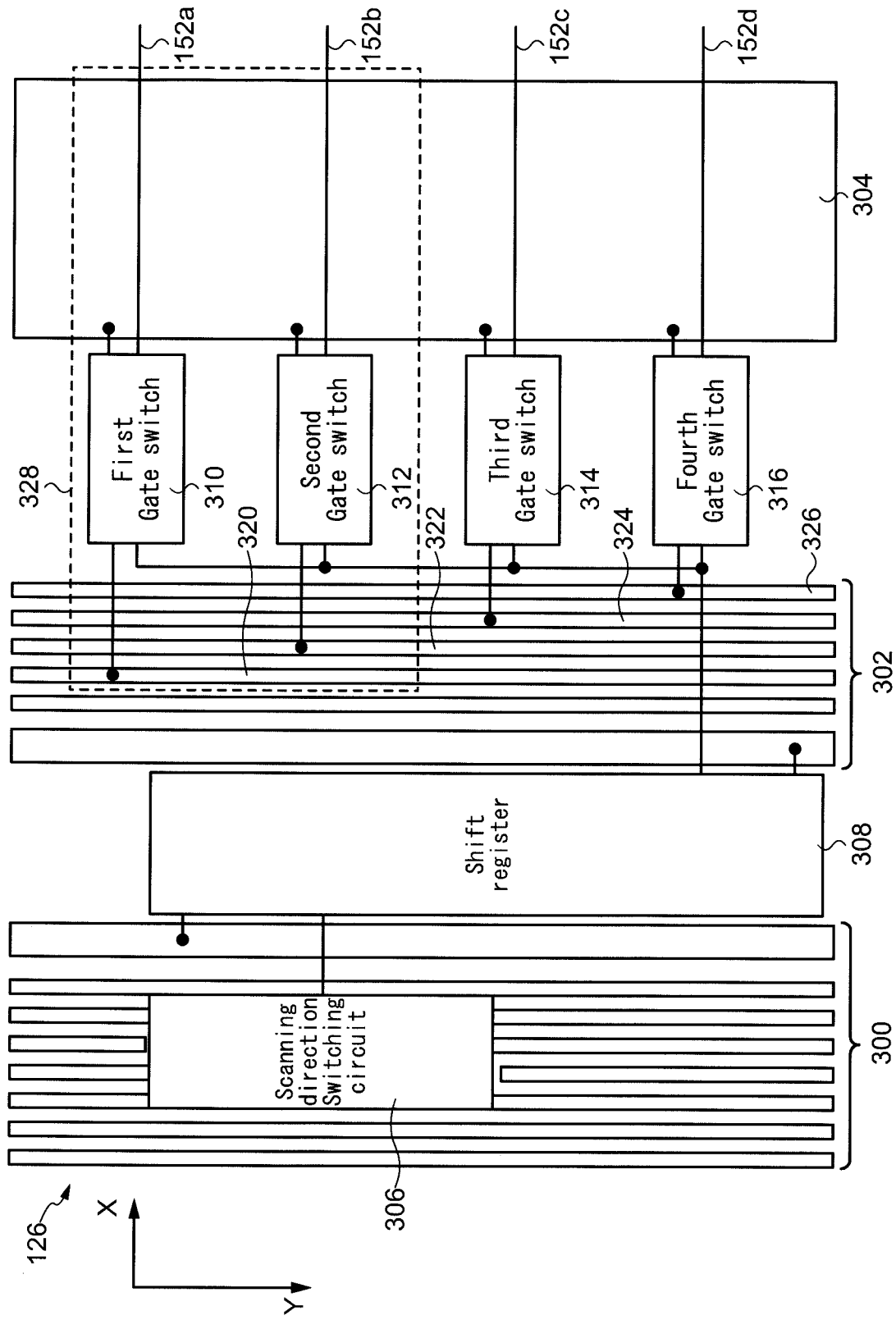
FIG. 6 is a schematic plan view showing a configuration of a scanning line driving circuit according to an embodiment of the present invention.
Figure 7:
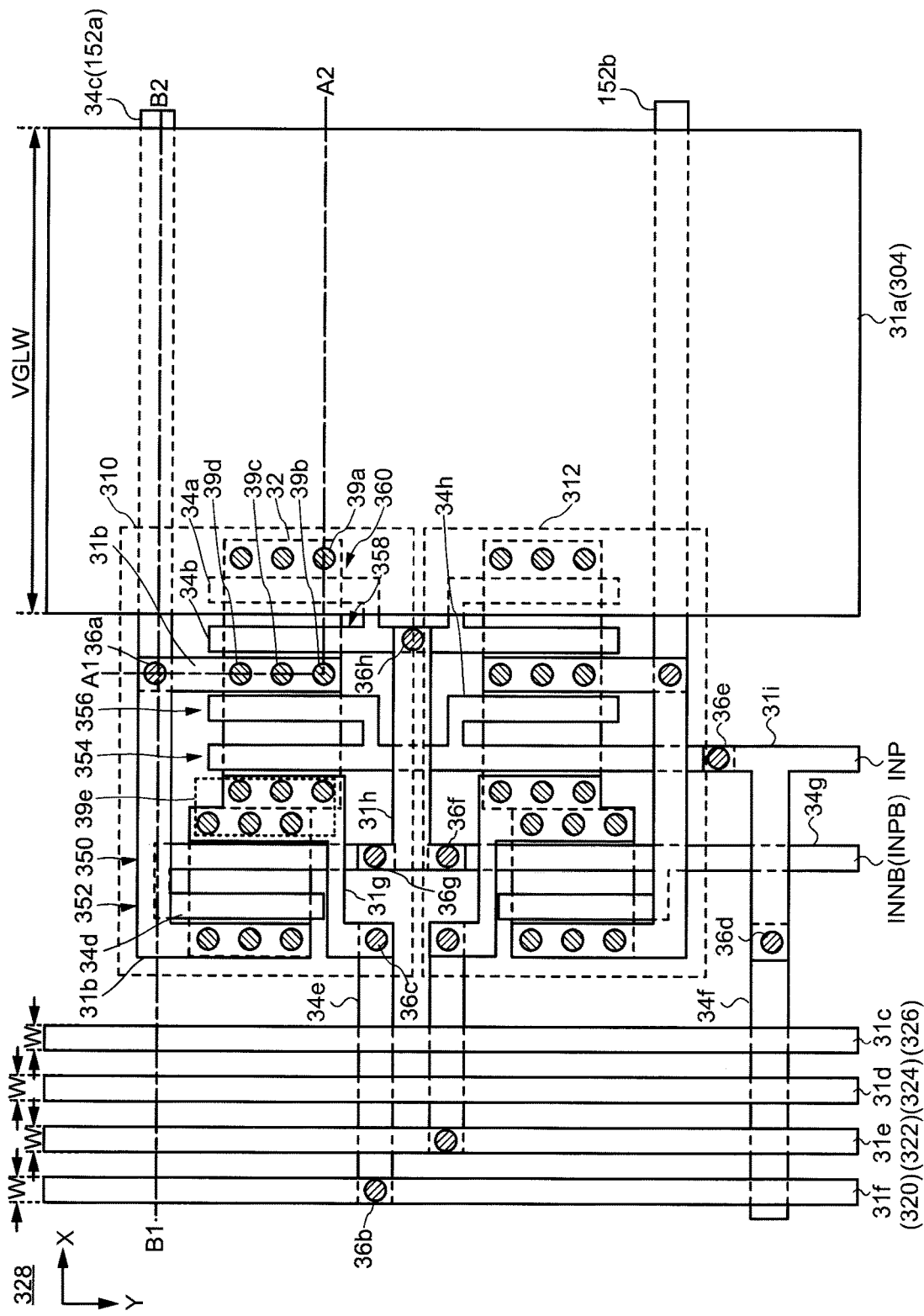
FIG. 7 is a diagram showing an exemplary layout of a part of a scanning line driving circuit according to an embodiment of the present invention.
Figure 8:
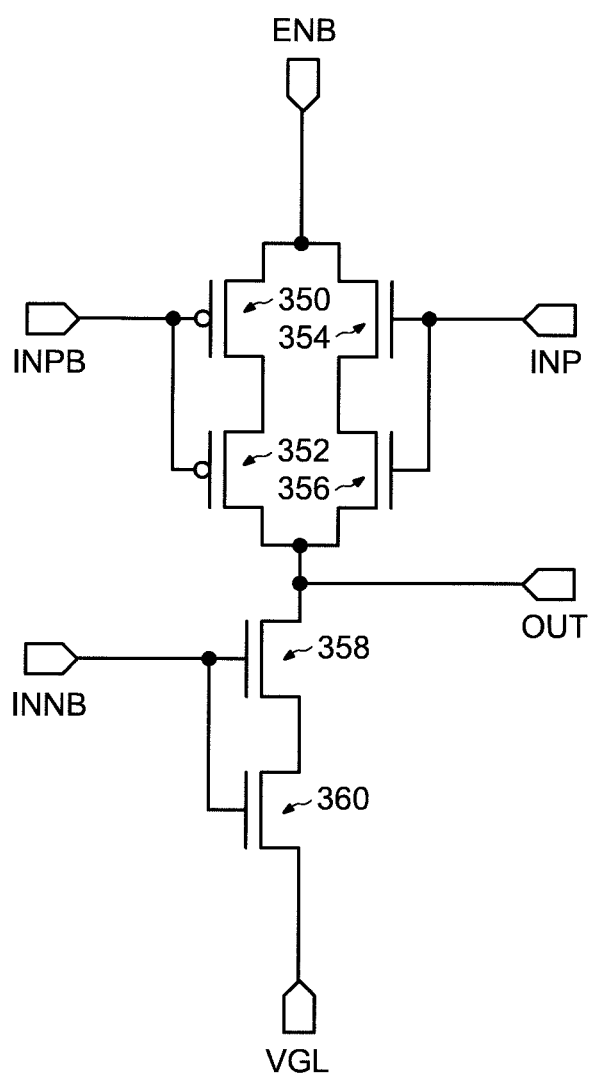
FIG. 8 is a circuit diagram showing a configuration of a gate switch according to an embodiment of the present invention.
Figure 9:
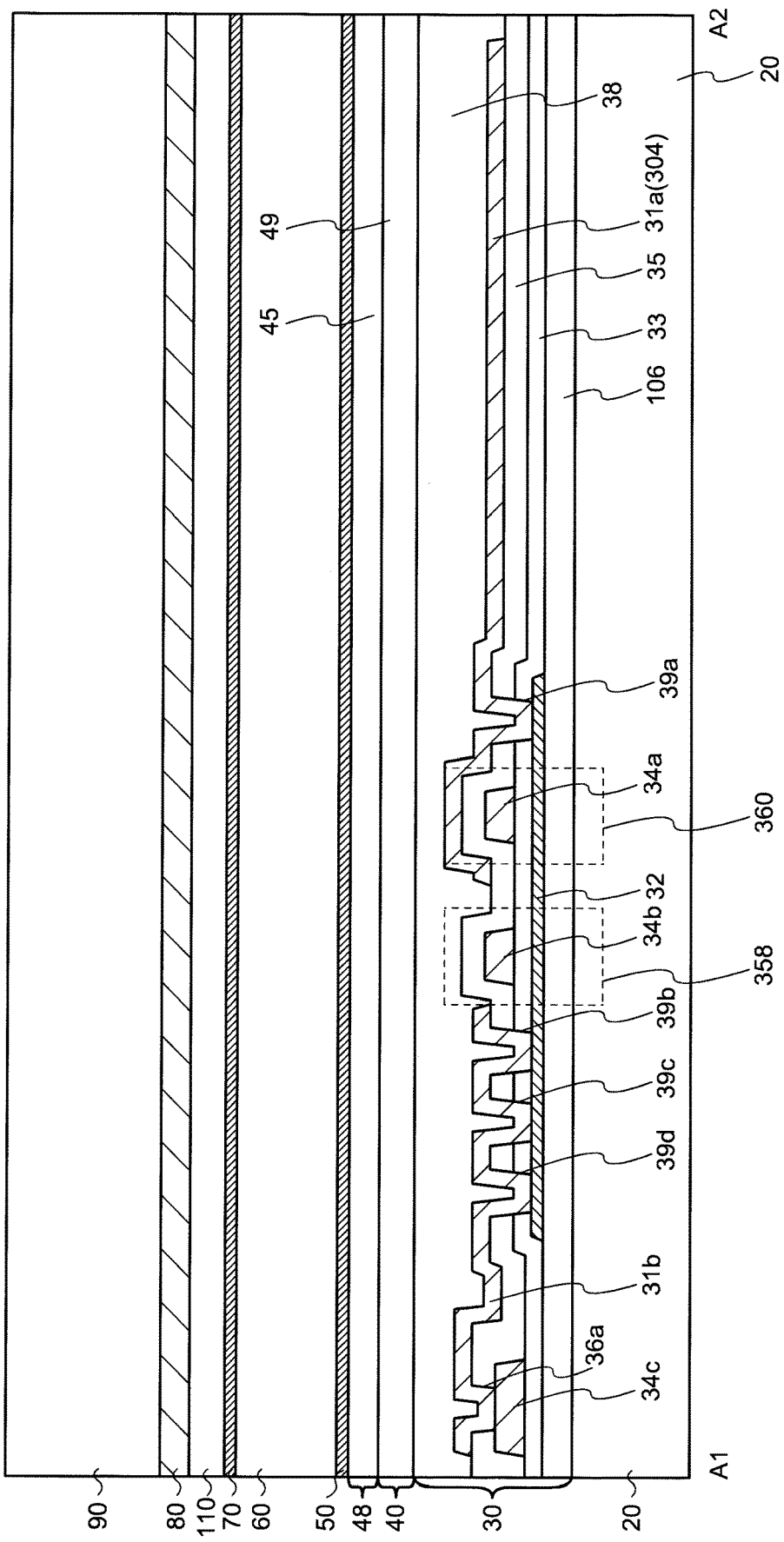
FIG. 9 is a cross-sectional view showing a cross-section along A1-A2 of FIG. 7.
Figure 10:
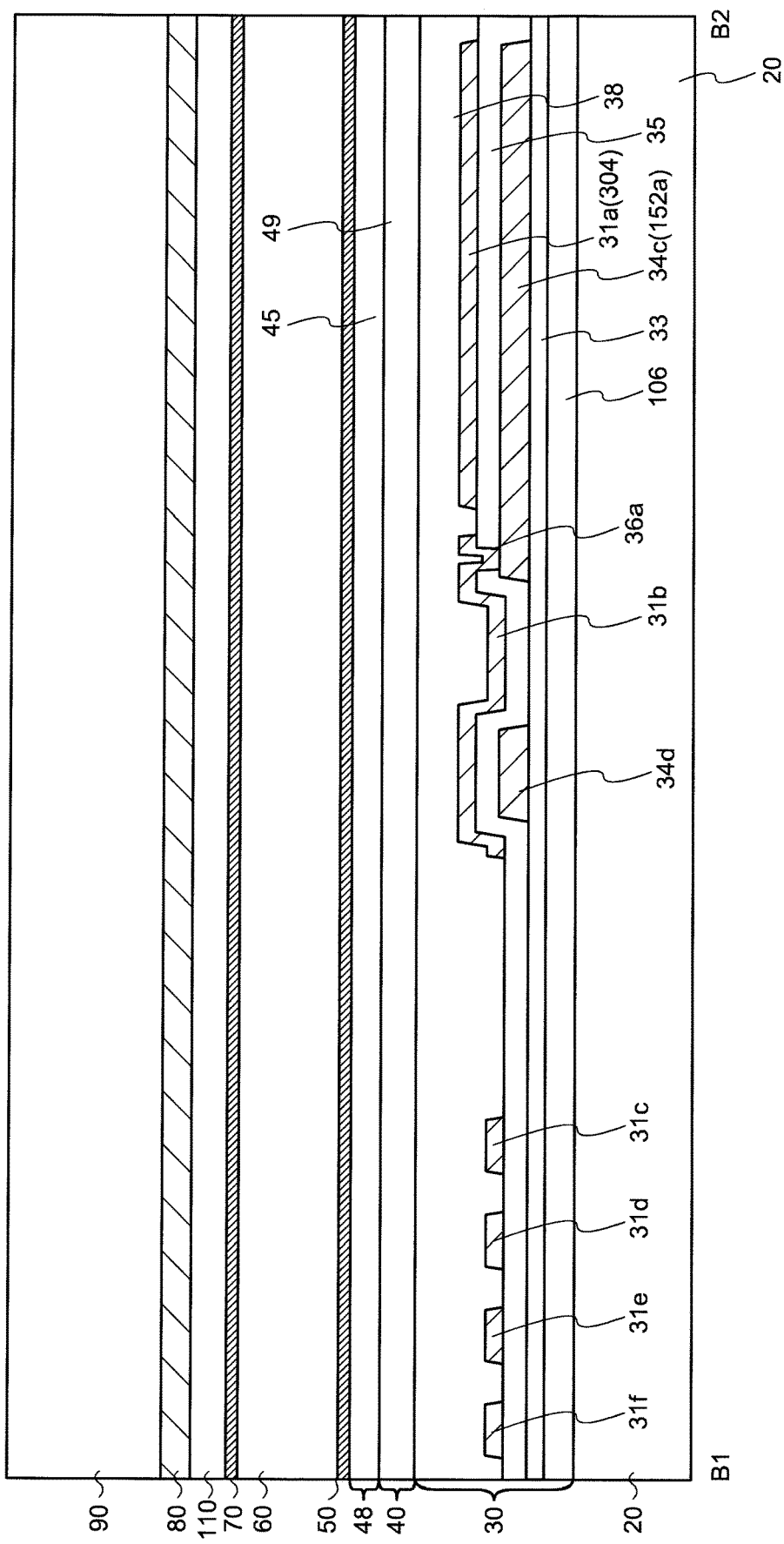
FIG. 10 is a cross-sectional view showing a cross-section along B1-B2 of FIG. 7.
Figure 11:
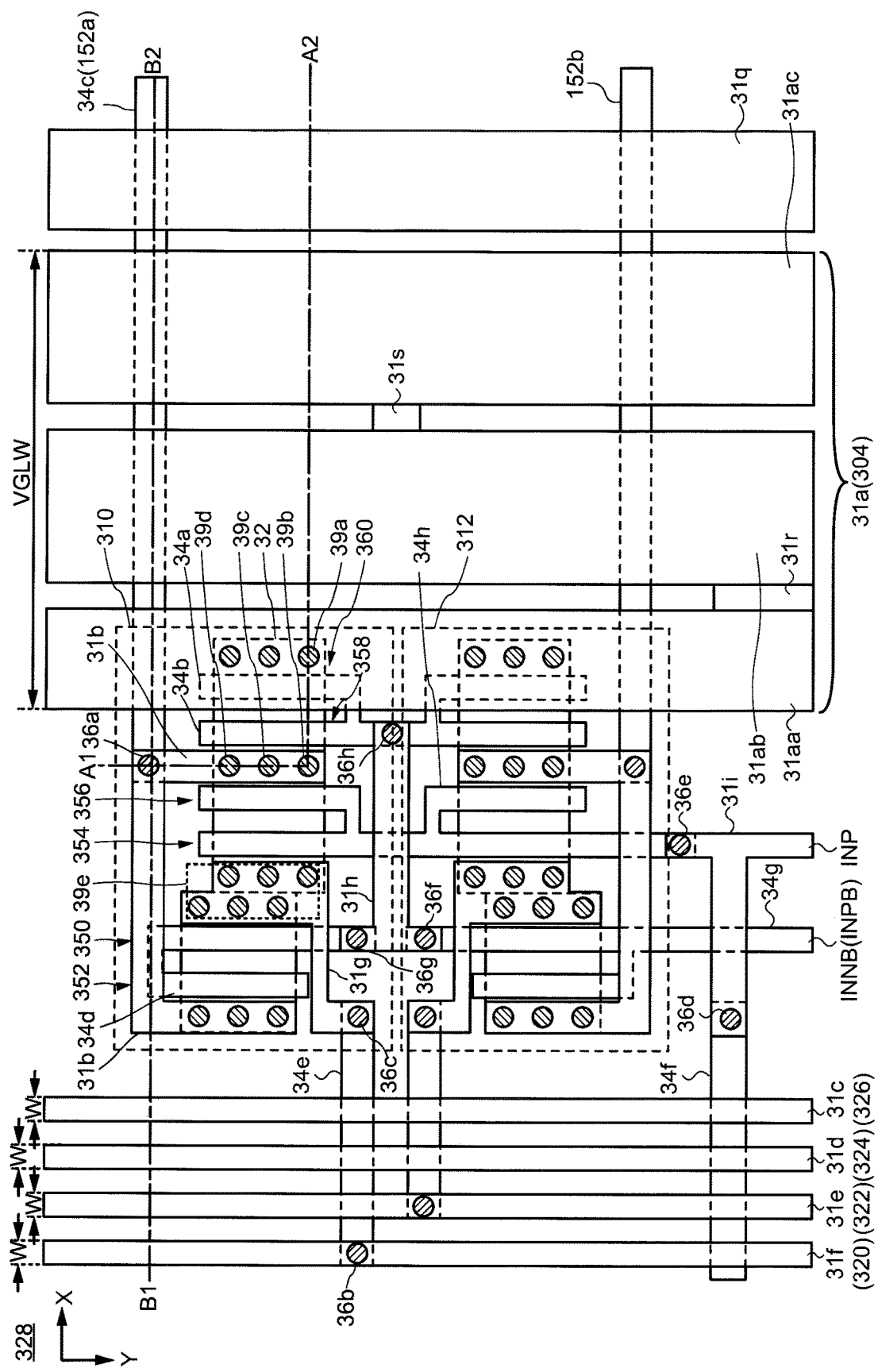
FIG. 11 is a diagram showing an exemplary layout of a part of a scanning line driving circuit according to an embodiment of the present invention.

FIGS. 6 to 11 are used to illustrate an example to reduce the time constant of the scanning signal line by increasing the line width of the power supply line 304. In the example using FIGS. 6 to 11, the power supply line 304 is formed of the second conductive film. FIG. 6 is a schematic plan view showing a configuration of the scanning signal line driving circuit 126 according to an embodiment of the present invention. FIG. 7 is a diagram showing an exemplary layout of a portion of the scanning signal line driving circuit 126 according to an embodiment of the present invention. FIG. 8 is a circuit diagram showing a configuration of a gate switch according to an embodiment of the present invention. FIG. 9 is a cross-sectional view showing a cross-section along A1-A2 of FIG. 7. FIG. 10 is a cross-sectional view showing a cross-section along B1-B2 of FIG. 7. FIG. 11 is a diagram showing an exemplary layout of a part of the scanning line driving circuit according to an embodiment of the present invention. An embodiment of the present invention shown in FIGS. 6 to 11 is an example and is not limited to the examples shown in FIGS. 6 to 11. The same or similar configurations as those of FIGS. 1 to 5 will not be described here.

As shown in FIG. 6, the scanning signal line driving circuit 126 includes a first wiring group 300, a second wiring group 302, the power supply line 304, a scanning direction switching circuit 306, a shift register 308, a first gate switch 310, a second gate switch 312, a third gate switch 314, and a fourth gate switch 316. The wiring or the signal line of the second wiring group 302 is referred to as a plurality of first power supply lines connected to the scanning signal line driving circuit 126. The power supply line 304 is referred to as the second power supply line or a power supply line for scanning signal line driving circuit.

The first wiring group 300 includes a scanning direction-switching signal line. The scanning direction-switching signal line is electrically connected to the scanning direction switching circuit 306. The scanning direction-switching signal line is supplied with a signal for switching the scanning direction of the scanning signal line driving circuit 126. The second wiring group 302 includes a first enable signal line 320, a second enable signal line 322, a third enable signal line 324 and a fourth enable signal line 326.

The scanning direction switching circuit 306 is provided to be surrounded by the first wiring group 300. The scanning direction switching circuit 306 is electrically connected to the shift register 308. The scanning direction switching circuit 306 is connected to the scanning direction-switching signal line. The scanning direction switching circuit 306 is supplied with a signal for switching the scanning direction of the scanning signal line driving circuit 126. The scanning direction switching circuit 306 switches the scanning direction of the shift register 308 based on the signal for switching the scanning direction.

The shift register 308 is provided between the first wiring group 300 and the second wiring group 302. The shift register 308 is electrically connected to the first gate switch 310, the second gate switch 312, the third gate switch 314, and the fourth gate switch 316. The shift register 308 input a shift signal from an adjacent shift register. Based on the shift signal, the shift register 308 generates a plurality of gate switch selection signals for selecting the first gate switch 310, the second gate switch 312, the third gate switch 314, and the fourth gate switch 316. The shift register 308 supplies the generated plurality of gate switch selection signals to each of the first gate switch 310, the second gate switch 312, the third gate switch 314, and the fourth gate switch 316. Of the plurality of gate switch selection signals, the gate switch selection signals corresponding to each of a gate switch signal line INNB, a gate switch selection signal line INPB, and a gate switch selection signal line INP are supplied to the gate switch selection signal line INNB, the gate switch selection signal line INPB, and the gate switch selection signal line INP.

The first gate switch 310, the second gate switch 312, the third gate switch 314, and the fourth gate switch 316 are provided between the second wiring group 302 and the power supply line 304. Each of the first gate switch 310, the second gate switch 312, the third gate switch 314, and the fourth gate switch 316 are connected to the gate switch selection signal line INNB, the gate switch selection signal line INPB, the gate switch selection signal line INP, and the power supply line 304. The first gate switch 310 is connected to the first enable signal line 320 and the scanning signal line 152a. The second gate switch 312 is connected to the second enable signal line 322 and the scanning signal line 152b. The third gate switch 314 is connected to the third enable signal line 324 and the scanning signal line 152c. The fourth gate switch 316 is connected to the fourth enable signal line 326 and the scanning signal line 152d.

For example, the first gate switch 310 is connected to the first enable signal line 320 and the scanning signal line 152a. The first gate switch 310 is supplied with the shift signal from the shift register 308, is supplied with a high potential voltage from the first enable signal line, and is supplied with a low potential voltage from the power supply line 304. The first gate switch 310 supplies a signal (selection signal) for selecting a sub-pixel connected to the scanning signal line 152a to the scanning signal line 152a based on the shift signal and the selection signals. Similar to the first gate switch 310, the second gate switch 312, the third gate switch 314, and the fourth gate switch 316 also based on the voltage and signals supplied from the respective signal line, and supplies a selection signal to the scanning signal line connected to the respective gate switch. The low potential voltage is, for example, a negative voltage relative to the common voltage. The low potential voltage may be the same as the common voltage and may be the same as 0 V. The high potential voltage is higher than the low potential voltage.

FIG. 7 is a diagram enlarged a region 328 shown in FIG. 6 and showing the first gate switch 310 and the second gate switch 312 vicinity in detail. The first gate switch 310 and the second gate switch 312 are provided between the first enable signal line 320, the second enable signal line 322, the third enable signal line 324, the fourth enable signal line 326, and the power supply line 304. The first gate switch 310 is connected to the first enable signal line 320, the gate switch signal line INNB, the gate switch selection signal line INPB, the gate switch selection signal line INP, the power supply line 304, and the scanning signal line 152a. The second gate switch 312 is connected to the second enable signal line 322, the gate switch selection signal line INNB, the gate switch selection signal line INPB, the gate switch selection signal line INP, the power supply line 304 and the scanning signal line 152b.

The first gate switch 310 and the second gate switch 312 has a circuit configuration shown in FIG. 8. Each of the first gate switch 310 and the second gate switch 312 is configured by a p-type transistor 350, a p-type transistor 352, an n-type transistor 354, an n-type transistor 356, an n-type transistor 358, and an n-type transistor 360. The respective transistors are provided between an enable signal line ENB and a power supply line VGL. The p-type transistor 350 and the p-type transistor 352 are electrically connected.

As shown in FIG. 8, the gate terminal of each of the p-type transistor 350 and the p-type transistor 352 is connected to the gate switch selection signal line INPB. The n-type transistor 354 and the n-type transistor 356 are electrically connected. The gate terminal of each of the n-type transistor 354 and the n-type transistor 356 is connected to the gate switch selection signal line INP. The n-type transistor 358 and the n-type transistor 360 are electrically connected. The gate terminal of each of the n-type transistor 358 and the n-type transistor 360 is connected to the gate switch signal line INNB. The p-type transistor 352, the n-type transistor 356 and the n-type transistor 358 are connected to an output terminal OUT.

Here, the enable signal line ENB is any one of the first enable signal line 320, the second enable signal line 322, the third enable signal line 324 and the fourth enable signal line 326. The first enable signal line 320 is formed by a sixth part of a second conductive film 31f. The second enable signal line 322 is formed by a fifth part of a second conductive film 31e. The third enable signal line 324 is formed by a fourth part of a second conductive film 31d. The fourth enable signal line 326 is formed by a third part of a second conductive film 31c. The line widths of the first enable signal line 320, the second enable signal line 322, the third enable signal line 324 and the fourth enable signal line 326 are respectively line width W.

The configuration of the gate switch shown in FIG. 8 is an example, and the configuration of the gate switch according to an embodiment of the present invention is not limited to the configuration shown in FIG. 8.

The power supply line VGL is the power supply line 304. The power supply line 304 is formed by a first part of a second conductive film 31a. The line width of the power supply line 304 is a line width VGLW.

In one embodiment of the present invention, the line width VGLW is preferably greater than four times the line width W and less than or equal to 40 times the line width W. Specifically, the line width VGLW is preferably greater than 20 μm and less than or equal to 100 μm. For example, in one embodiment, an example is shown in which the line width VGLW is 80 μm and the line width W is 5 μm.

In the display device 10 according to an embodiment of the present invention, the line width of the power supply line 304 is much thicker than the line width of each enable signal line and is thicker than the line width of the conventional power supply line. Therefore, when the length of the power supply line 304 according to an embodiment of the present invention is the same as the line width of each enable signal line and the line width of the conventional power supply line, resistance value of the power supply line 304 is smaller than the resistance value of each enable signal line and the resistance value of the conventional power supply line. In the display device 10 according to an embodiment of the present invention, the resistance of the power supply line is small. As a result, it is possible to converge the increase of the potential of the unselected scanning signal line caused by capacitive coupling between the unselected scanning signal line and the parasitic capacitance Csc and Cgc to the vicinity of the original potential faster. Therefore, the potential of the reference power supply line 168 caused by the capacitive coupling between the unselected scanning signal line and the parasitic capacitances Csc and Cgc can be quickly converged to the vicinity of the original potential. That is, by using the display device 10 according to an embodiment of the present invention, a decrease in the voltage applied to each pixel and the occurrence of crosstalk are suppressed. As a result, it is possible to suppress a decrease in the display quality of the display device by using the display device 10 according to an embodiment of the present invention.

As shown in FIG. 7, the first gate switch 310, for example, inputs a first enable signal from the first enable signal line 320, via a second opening 36b, a fourth part of a first conductive film 34e, a second opening 36c, a seventh part of a second conductive film 31g, and a first opening group 39e. The first gate switch 310, for example, inputs the gate switch selection signal from the gate switch selection signal line INP connected to the shift register 308 via a fifth part of a first conductive film 34f, a second opening 36d, a ninth part of a second conductive film 31i, a second opening 36e, and a seventh part of a first conductive film 34h. The first gate switch 310, for example, inputs the gate switch selection signal from the gate switch selection signal line INNB (INPB) connected to the shift register 308, via a sixth part of a first conductive film 34g, a second opening 36f, an eighth part of a second conductive film 31h, second openings 36g and 36h, a first part of a first conductive film 34b and a third part of a first conductive film 34d. The first gate switch 310 outputs a signal (selection signal) for selecting a sub-pixel connected to the scanning signal line 152a via the power supply line 304, a first opening 39a, a semiconductor film 32, and first openings 39b, 39c, and 39d, a second part of a second conductive film 31b, a second opening 36a, and a second part of a first conductive film 34c (the scanning signal line 152a).

Next, a cross-sectional configuration of the scanning signal line driving circuit 126 according to an embodiment of the present invention will be described referring to FIGS. 9 and 10.

As shown in FIGS. 9 and 10, the display device 10 includes the first substrate 20, a TFT-array layer 30, a wiring layer 40, an electrode layer 48, a first orientation film 50, a liquid crystal layer 60, a second orientation film 70, a color filter layer 80, the second substrate 90, and an overcoat layer 110. A pixel electrode included in the pixel PX is provided between the wiring layer 40 and the first orientation film 50.

The TFT-array layer 30 and the wiring layer 40 are provided on the first substrate 20. The TFT array layer 30 is provided with the display unit 122, the video signal line driving circuit 124, transistors of the scanning signal line driving circuit 126, and the terminal electrode 240. The terminal electrode 240 is electrically connected to the wiring substrate 214.

The TFT array layer 30 comprises an under film 106, the semiconductor film 32, a gate insulating film 33, a gate electrode 34a, the first part of the first conductive film 34b (gate electrode), the second part of the first conductive film 34c, an insulating film 35, the first of the second conductive film 31a and the second of the second conductive film 31b, the first openings 39a, 39b, 39c and 39d, the second opening 36a, and a planarization film 38.

The under film 106 is provided on the first substrate 20. Although the under film 106 is configured by a single layer of the insulating film, the present invention is not limited to this example. The under film 106 may be configured by 2 or more layers of the insulating film.

The semiconductor film 32 is provided on the under film 106. The semiconductor film 32 includes semiconductor films of the n-type transistor 358 and the n-type transistor 360. The semiconductor films of the transistors are provided in the same layer as the semiconductor film 32.

The gate insulating film 33 is provided to cover the semiconductor film 32. The gate electrode 34a, the first part of the first conductive film 34b (gate electrode), and the second part of the first conductive film 34c (the scanning signal line 152a) are provided on the gate insulating film 33. The third part of the first conductive film 34d the fourth part of the first conductive film 34e, the fifth part of the first conductive film 34f, the sixth part of the first conductive film 34g and the seventh part of the first conductive film 34h (FIG. 7) are also provided in the same layer as the gate electrode 34a, the first part of the first conductive film 34b (gate electrode), and the second part of the first conductive film 34c. For example, the gate electrode 34a is the gate electrode 162G of the n-type transistor 360, and the first part of the first conductive film 34b (gate electrode) is the gate electrode 162G of the n-type transistor 358. The gate electrode 34a and the first part of the first conductive film 34b (gate electrode) are the first conductive films. As a material forming the first conductive film, for example, metals such as titanium (Ti), aluminum (Al), copper (Cu), tungsten (W), tantalum (Ta), and alloys thereof can be used. The first conductive film can be formed to have a single layer or a stacked structure.

The insulating film 35 is provided to cover the gate electrode 34a, the first part of the first conductive film 34b (gate electrode), and the second part of the first conductive film 34c. As a material for forming the insulating film 35, an inorganic insulator such as silicon nitride (SiN), silicon oxide ($SiO_2$), or silicon nitride oxide (SiON) can be used. The insulating film 35 can be formed to have a single layer or the stacked structure.

The first opening is the opening for opening the gate insulating film 33, the insulating film 35, and electrically connecting the semiconductor film and the second conductive film. Although described later in detail, the first opening is the opening for opening the gate insulating film 33, the insulating film 35, the under film 106, and electrically connecting the semiconductor film, the second conductive film, and a fifth conductive film. In FIG. 7, the first opening 39a, the first opening 39b, the first opening 39c, and the first opening 39d open the gate insulating film 33 and the insulating film 35, and electrically connect a semiconductor film 42 and the first part of the second conductive film 31a and the second part of the second conductive film 31b. The first opening group 39e (FIG. 7) is also provided in the same layer as the first opening 39a, the first opening 39b, the first opening 39c, and the first opening 39d.

The second opening is an opening for opening the insulating film 35 and electrically connecting the first conductive film and the second conductive film. In FIG. 7, the second opening 36a opens the insulating film 35, and electrically connects the second part of the first conductive film 34c and the second part of the second conductive film 31b. The second opening 36b, the second opening 36c, the second opening 36d, the second opening 36e, the second opening 36f, the second opening 36g, and the second opening 36h (FIG. 7) are also provided in the same layer as the second opening 36a. The first part of the second conductive film 31a includes the power supply line 304.

The first part of the second conductive film 31a and the second part of the second conductive film 31b are provided on the upper surface of the insulating film 35, the side surface and the bottom surface of the first opening (side surface of the insulating film 35, the side surface of the gate insulating film 33). The second conductive films 31c to 31i (FIG. 7) are also provided in the same layer as the first of the second conductive film 31a and the second of the second conductive film 31b. The first part of the second conductive film 31a includes the power supply line 304. The second part of the second conductive film 31b is the source electrodes or the drain electrodes of the n-type transistor 358, the n-type transistor 356, and the p-type transistor 352. The second conductive film can be formed using the same materials and structures as those of the first conductive film. As shown in FIGS. 1, 7, 9, and 10, the first part of the second conductive film 31a is provided to be included in the scanning signal line driving circuit 126 but is not limited to the example shown here. The first part of the second conductive film 31a may be extended to the side on which the display unit 122 is provided along the X-direction, or may be extended to the opposite side on which the display unit 122 is provided along the X-direction, so as not to affect the display. By extending the first part of the second conductive film 31a, it is possible to further thicken the line width of the first part of the second conductive film 31a, it is possible to further reduce the time constant of the scanning signal line.

The planarization film 38 is provided to cover the first conductive film. The planarization film 38 alleviates the unevenness when forming the film, the wiring, the transistors, and the like of the lower layer than the planarization film 38. The films or patterns formed after the planarization film 38 can be formed on a flat surface. For example, a polyimide-based or an acrylic-based resin can be used as the material for forming the planarization film 38. By using the polyimide-based or the acrylic-based resin, light can be sufficiently transmitted.

Methods of forming the TFT-array layer 30, structures such as the transistors, and the respective films, the layers, and the member may be applied methods commonly used in the art of the present invention.

The wiring layer 40 is provided over the planarization film 38. The wiring layer 40 is formed of the third conductive film and the organic film 49. The organic film 49 is provided to cover the third conductive film. The third conductive film is, for example, a film forming the reference power supply line 168 (FIG. 3) and the wiring 522. By providing the organic film 49 to cover each third conductive film, it is possible to prevent the respective third conductive films from contacting each other and conducting. The organic film 49 alleviates the unevenness when the film, the wiring, the transistor, or the like of the lower layer of the organic film 49 are formed. Therefore, the films or the patterns formed after the organic film 49 can be formed on a flat surface. The material forming the third conductive film may be a conductive metallic material such as aluminum (Al), titanium (Ti), tungsten (W). The material for forming the organic film 49 may be a material similar to that for forming the planarization film 38.

The electrode layer 48 is provided on the organic film 49. The electrode layer 48 is configured by, for example, the fourth conductive film 47 (FIG. 26), and an organic insulating film 45. The organic insulating film 45 is provided to cover the fourth conductive film 47. For example, the reference power supply line 168, the touch electrode, and the common electrode 530 are provided by using the fourth conductive film 47. The wiring connecting each electrode, power source line, and wiring may be provided by using the fourth conductive film 47. The fourth conductive film 47 is electrically connected to the third conductive film via, for example, an opening (not shown) opening the organic film 49. The fourth conductive film or the third conductive film, for example, is drawn to the peripheral part 136, and the fourth conductive film or the third conductive film is electrically connected to the first terminal 212, the second terminal 222, or the terminal electrode 240. With such a configuration, it is possible to have a configuration for supplying a voltage independently to each of the reference power supply line 168 and the common electrode 530. As a material for forming the fourth conductive film 47, for example, a transparent conductive film such as ITO (Indium Tin Oxide) or IZO (Indium Zinc Oxide) can be used. Thin films of conductive metallic materials such as aluminum (Al), titanium (Ti), tungsten (W) may be used. The material forming the organic insulating film 45 may be the same material as the material forming the organic film 49 and the planarization film 38.

A pixel electrode 52 (FIGS. 25 and 26) is provided above the organic insulating film 45, as will be described below. The first orientation film 50 is applied over the pixel electrode 52. The first orientation film 50 is formed of a material exhibiting lateral orientation and is arranged on a surface where the first substrate 20 is facing the liquid crystal layer 60. By applying the first orientation film 50 to cover each pixel electrode 52, the pixel electrode of each pixel can be prevented from contacting each other and conducting to each other. The pixel electrode 52 is connected to the drain electrode 162D of the pixel, to which the voltage corresponding to the video signal is applied and drives the liquid crystal element included in the liquid crystal layer 60. As a material for forming the pixel electrode 52, for example, a material having a transparent conductive film similar to that of the material for forming the fourth conductive film can be used. As a material for forming the first orientation film 50, for example, a resin such as a polyimide-based can be used.

In this specification and the like, for example, the first substrate 20 side is referred to as a TFT-array side substrate and the second substrate 90 side is referred to as an opposite side substrate with the liquid crystal layer 60 interposed therebetween. In the display device 10 according to an embodiment of the present invention, the second orientation film 70, the color filter layer 80, the second substrate 90, and the overcoat layer 110 are provided with the liquid crystal layer 60 interposed therebetween. The color filter layer 80 is provided on the second substrate 90, and the second orientation film 70 is provided on the overcoat layer 110. As a material for forming the second orientation film 70, for example, a resin such as a polyimide-based can be used. The color filter layer 80 includes a color filter layer with red color, a color filter layer with green color, a color filter layer with blue color, and a color filter layer with white color. The overcoat layer 110 covers the color filter layer 80 and planarizes the color filter layer 80. For example, a resin of an organic material can be used for the overcoat layer 110. The overcoat layer 110 may be configured by a plurality of layers. With such a configuration, it is possible to prevent the display device 10 from being damaged.

As shown in FIG. 11, in the power supply line 304, a plurality of fourteenth part of second conductive films 31aa, fifteenth part of second conductive films 31ab, and sixteenth part of second conductive films 31ac may be configured by a second conductive film 31r, and the second conductive film 31s. For example, the plurality of the fourteenth part of second conductive films 31aa, the fifteenth part of the second conductive film 31ab, and the sixteenth part of the second conductive film 31ac are provided with a gap from each other, the fourteenth part of the second conductive film 31 as is connected to the fifteenth part of the second conductive film 31ab via the second conductive film 31r intersecting the fourteenth part of the second conductive film 31aa, and the fifteenth part of the second conductive film 31ab may be connected to the sixteenth part of the second conductive film 31ac via the fifteenth part of the second conductive film 31ab intersecting the fifteenth part of the second conductive film 31ab. As shown in FIG. 11, a wiring adjacent to the power supply line 304 and supplying a voltage to the common electrode may be provided by using the second conductive film 31q. For example, when bonding the first substrate 20 and the second substrate 90 by using the sealing portion, UV-light is irradiated on the material used for the sealing portion. With the power source line 304 is configured to have gaps, UV-light easily passes through the gaps and easily irradiates the material used for the sealing portion. As a result, it is possible to easily cure the sealing portion.

For example, the line widths of the plurality of the four tenth part of second conductive films 31aa, the fifteenth part of the second conductive films 31ab, the sixteenth part of the second conductive films 31ac, the second conductive film 31r, and the second conductive film 31s are 20 μm, 30 μm, 30 μm, 20 μm, and 10 μm, respectively. For example, the line width of the second conductive film 31q is 20 μm. In the example shown in FIG. 11, the total line width of the power supply line 304 is 80 μm, which is four times the line width of the wiring supplying the voltage to the common electrode.

As described above, in the display device according to an embodiment of the present invention, the power supply line is provided at the second conductive film, and the line width of the power supply line 304 is very thicker than the line width of each enable signal line, thicker than the line width of the conventional power supply line. Consequently, the resistance value of the power supply line can be smaller than the resistance value of the respective enable signal line and the resistance value of the conventional power supply line. Therefore, in the display device according to an embodiment of the present invention, by the resistance value of the power supply line is small, it is possible to suppress a decrease in the voltage applied to the respective pixel caused by the capacitive coupling between the scanning signal line and the parasitic capacitance. According to the present invention, it is possible to provide a display device capable of suppressing the generation of crosstalk and suppressing the deterioration of the display quality.

2. Second Embodiment

In the second embodiment, an example in which the power supply line 304 is formed by the second conductive film and the third conductive film will be described referring to FIGS. 12 to 14. Since the configuration other than the configuration in which the power supply line 304 is formed by the second conductive film and the third conductive film is the same as the configuration described in the first embodiment, the same or similar configuration as in FIGS. 1 to 10 will not be described here. An embodiment of the present invention shown in FIGS. 12 to 14 is an example, and is not limited to the example shown in FIGS. 12 to 14.

Figure 12:
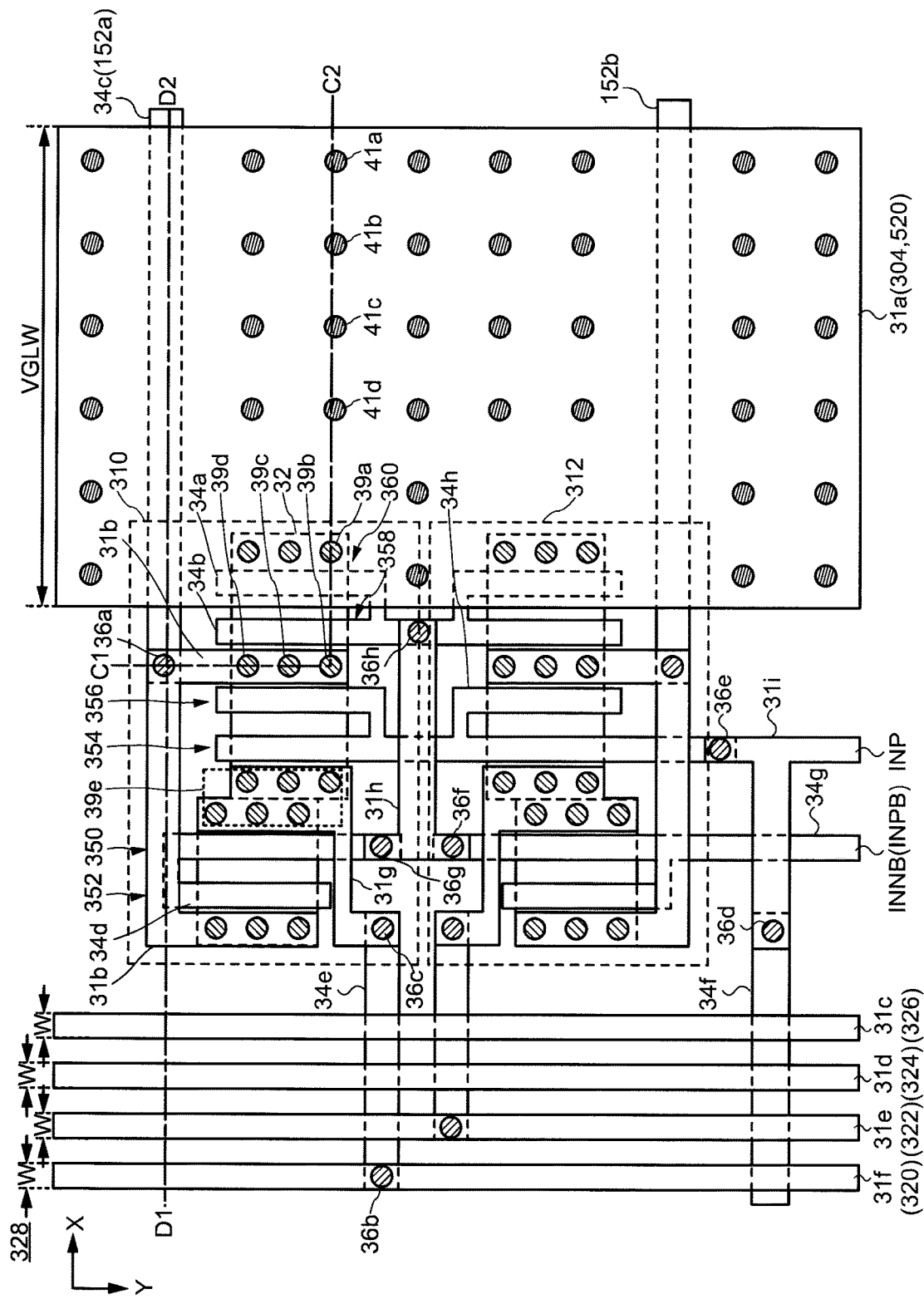
FIG. 12 is a diagram showing an exemplary layout of a part of a scanning line driving circuit according to an embodiment of the present invention.

FIG. 12 is a diagram showing an exemplary layout of a portion of the scanning signal line driving circuit 126 according to an embodiment of the present invention. FIG. 13 is a cross-sectional view showing a cross-section along C1-C2 of FIG. 12. FIG. 14 is a cross-sectional view showing a cross-section along D1-D2 of FIG. 12.

Figure 13:
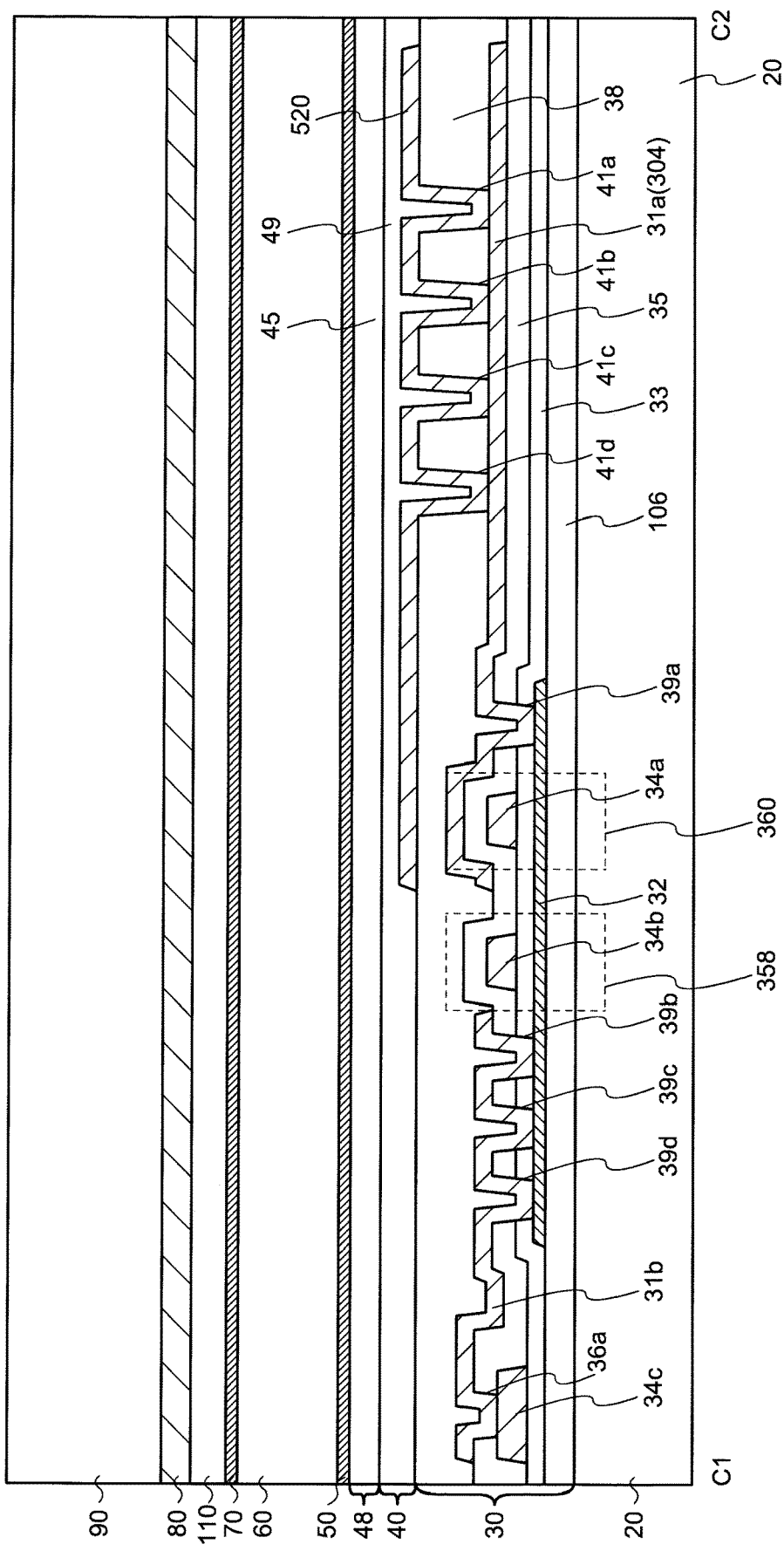
FIG. 13 is a cross-sectional view showing a cross-section along C1-C2 of FIG. 12.
Figure 14:
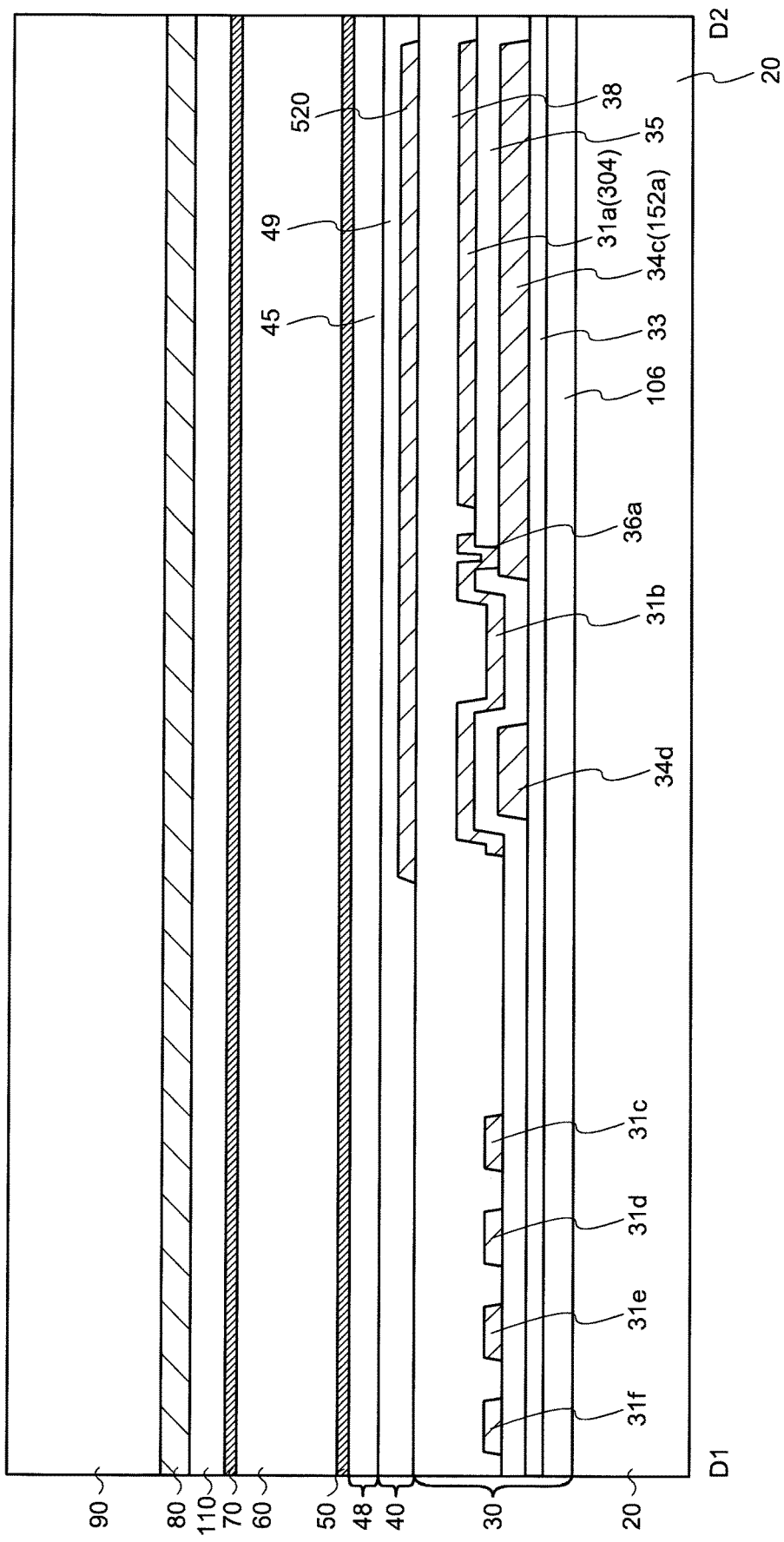
FIG. 14 is a cross-sectional view showing a cross-section along D1-D2 of FIG. 12.

As shown in FIGS. 12 to 14, a third opening is an opening for opening the planarization film 38 and electrically connecting the second conductive film and the third conductive film. The scanning signal line driving circuit 126 has a plurality of third openings. The plurality of third openings include a third opening 41a, a third opening 41b, a third opening 41c, and a third opening 41d. The plurality of third openings including the third opening 41a, the third opening 41b, the third opening 41c, and the third opening 41d electrically connect the first part of the second conductive film 31a and a third conductive film 520.

As shown in FIG. 14, the third conductive film 520 is provided between the second substrate 90 and the second conductive film and is provided to overlap the first part of the second conductive film 31a. That is, the first part of the second conductive film 31a and the third conductive film 520 includes the power supply line 304.

In the second embodiment, by stacking the third conductive film 520 and the first part of the second conductive film 31a and connecting them by the third opening, it is possible to increase the thickness of the power source line 304. Therefore, by increasing the line width of the power supply line 304 and further increasing the thickness of the power supply line 304, it is possible to further reduce the resistance value of the power supply line 304. Therefore, it is possible to further reduce the time constant of the scanning signal line.

In the second embodiment, as in the first embodiment, the first part of the second conductive film 31a or the third conductive film 520 may be extended to the side on which the display unit 122 is provided along the X-direction, or may be extended to the opposite side on which the display unit 122 is provided along the X-direction, so as not to affect the display. By extending the first part of the second conductive film 31a or the third conductive film 520, it is possible to further thicken the line width of the first part of the second conductive film 31a or the third conductive film 520, it is possible to further reduce the time constant of the scanning signal line.

3. Third Embodiment

In the third embodiment, an example in which the power supply line 304 is formed by the second conductive film, the third conductive film, and the fifth conductive film will be described referring to FIGS. 15 to 17. Since the configuration other than the configuration in which the power supply line 304 is formed by the second conductive film, the third conductive film, and the fifth conductive film is the same as the configuration described in the first embodiment or the second embodiment, the same or similar configuration as in FIGS. 1 to 14 will not be described here. The embodiment of the present invention shown in FIGS. 15 to 17 is an example and is not limited to the example shown in FIGS. 15 to 17.

Figure 15:
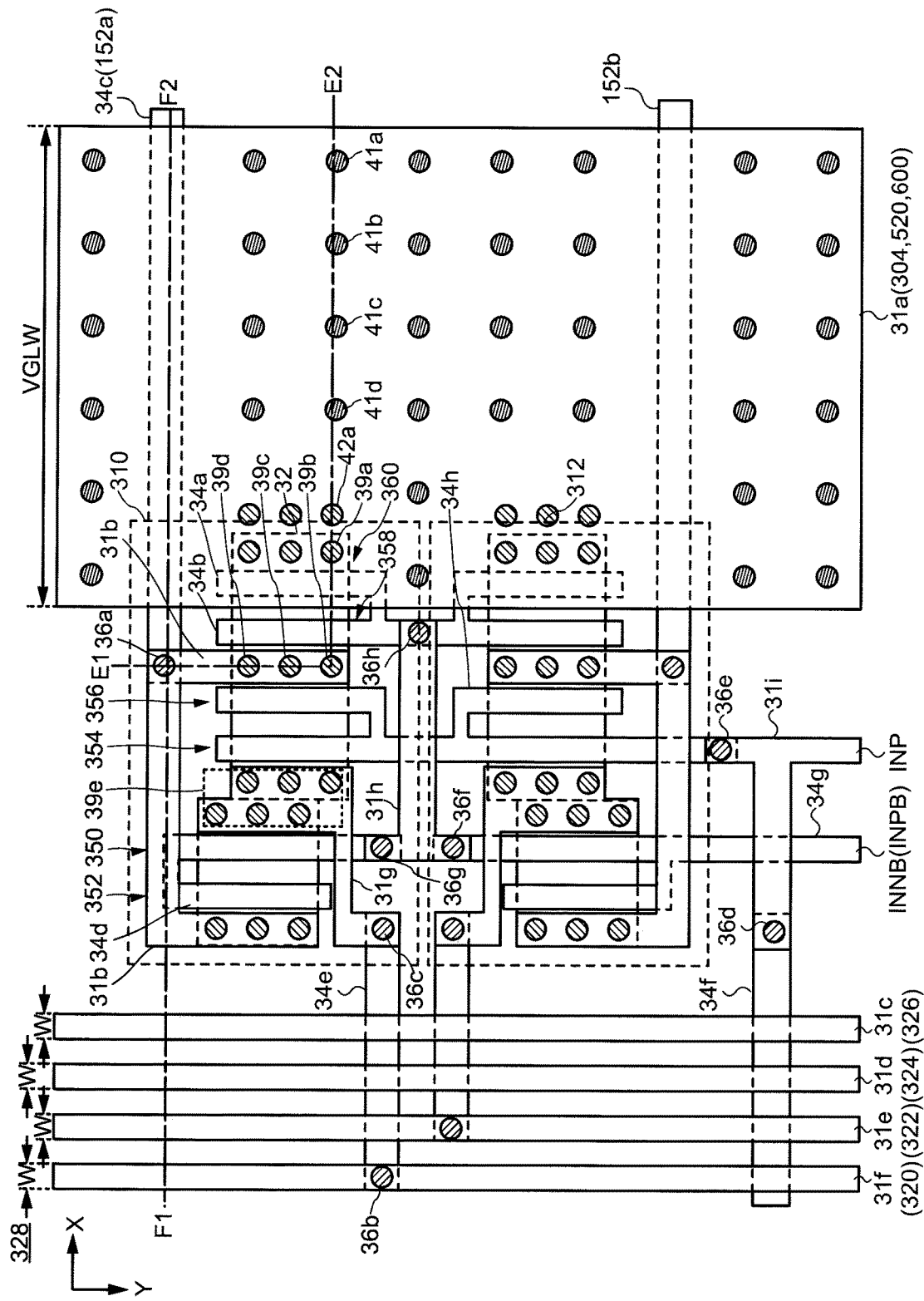
FIG. 15 is a diagram showing an exemplary layout of a part of a scanning line driving circuit according to an embodiment of the present invention.

FIG. 15 is a diagram showing an exemplary layout of a portion of the scanning signal line driving circuit 126 according to an embodiment of the present invention. FIG. 16 is a cross-sectional view showing a cross-section along E1-E2 of FIG. 15. FIG. 17 is a cross-sectional view showing a cross-section along F1-F2 of FIG. 15.

Figure 16:
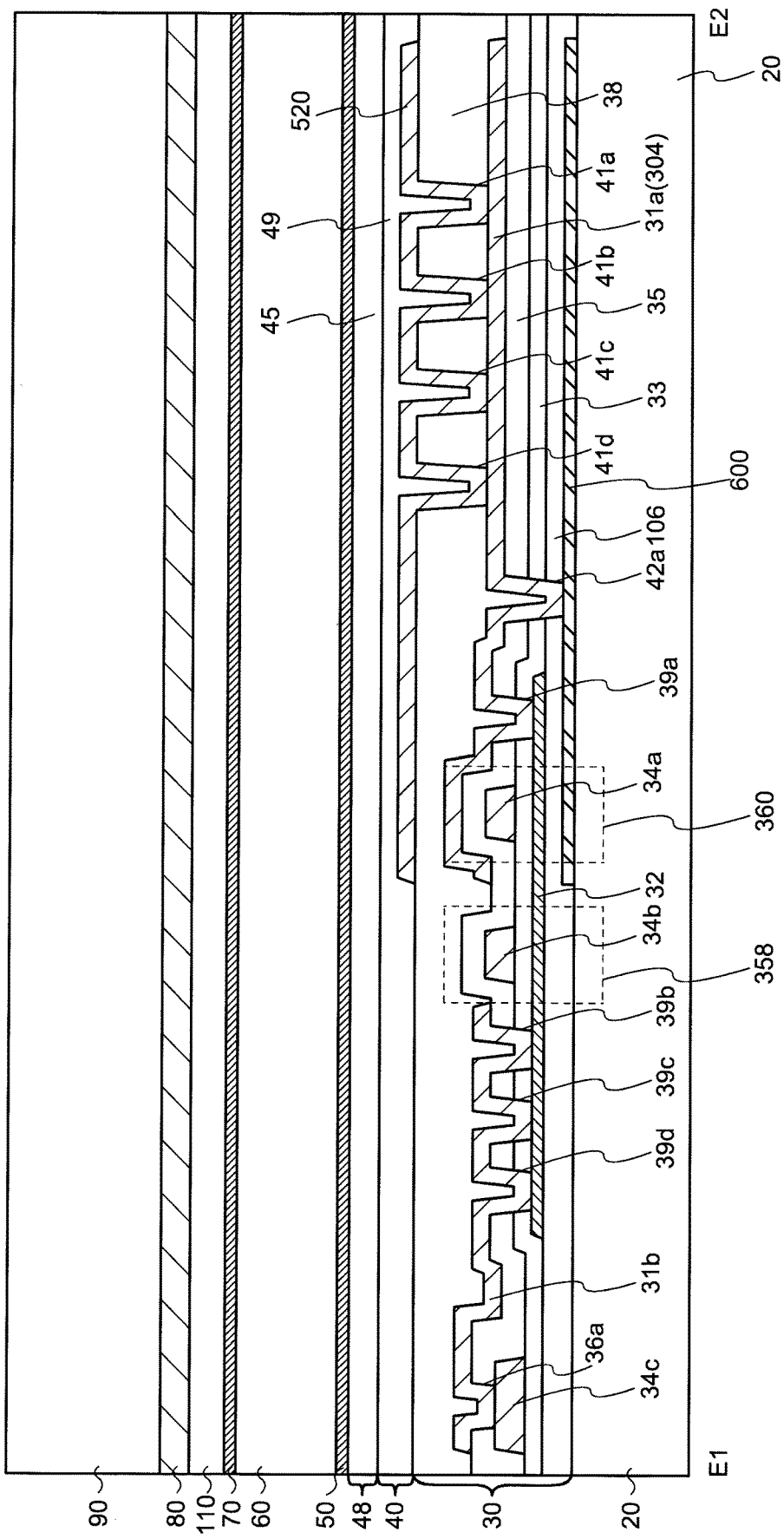
FIG. 16 is a cross-sectional view showing a cross-section along E1-E2 of FIG. 15.
Figure 17:
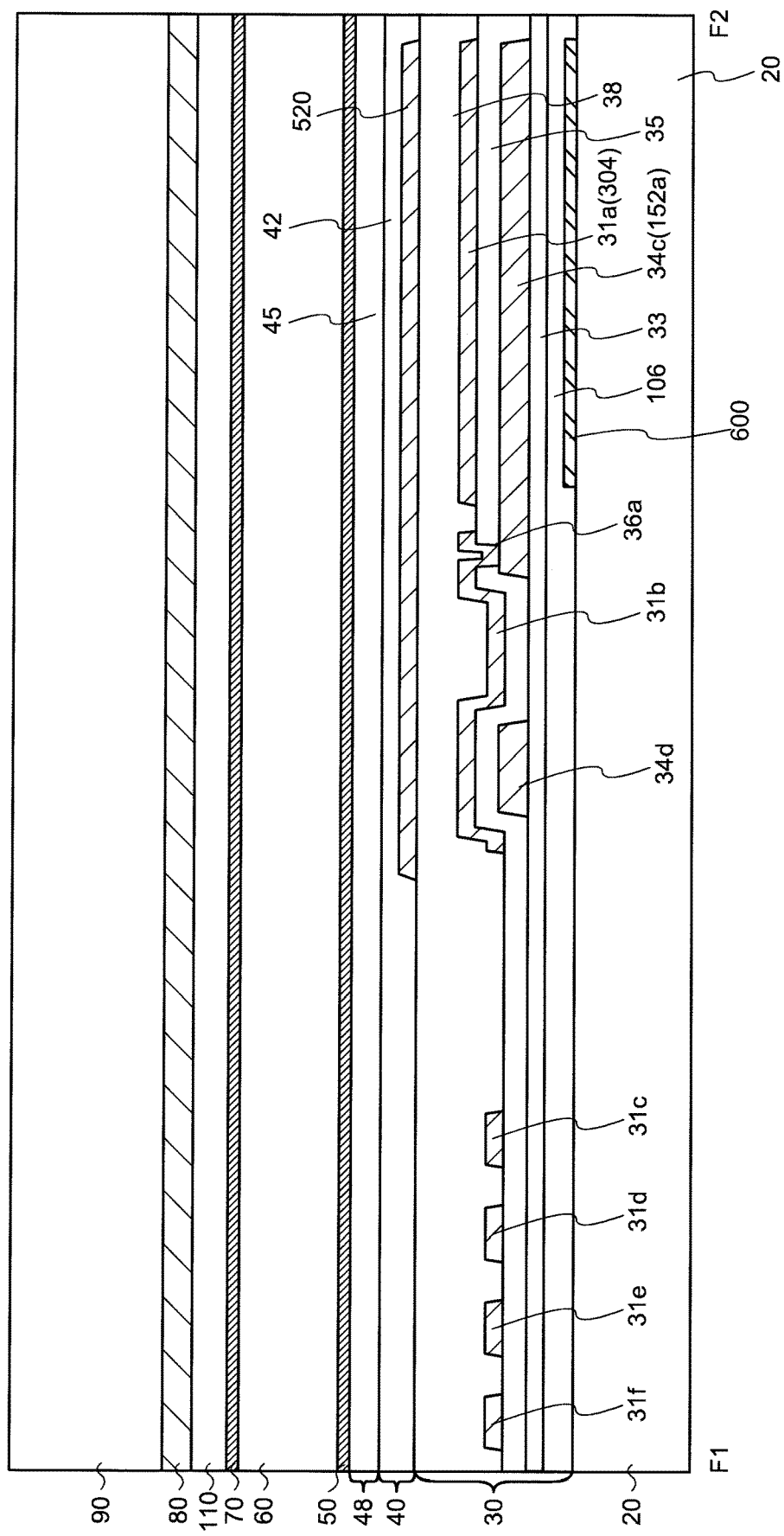
FIG. 17 is a cross-sectional view showing a cross-section along F1-F2 of FIG. 15.

As shown in FIGS. 15 to 17, the fifth conductive film is provided on the first substrate 20. The fifth conductive film serves, for example, as a light shield. The fifth conductive film is stacked in the power supply line 304 and has a role of reducing the resistance value of the power supply line 304. The scanning signal line driving circuit 126 has a fifth conductive film 600. The fifth conductive film 600 is electrically connected to the first part of the second conductive film 31a and the third conductive film 520 via a fourth opening 42a, the third opening 41a, the third opening 41b, the third opening 41c, and the third opening 41d. The fourth opening opens the insulating film 35, the gate insulating film 33, and the under film 106, and electrically connects the fifth conductive film and the second conductive film. The first opening and the fourth opening may be opened in the same step, and each opening may be opened in different steps. The fifth conductive film is provided between the first substrate 20 and the second conductive film. The second conductive film is provided between the fifth conductive film and the third conductive film. The third conductive film is provided between the second conductive film and the second substrate 90.

In the third embodiment, the fifth conductive film 600, the third conductive film 520, and the first part of the second conductive film 31a are stacking. The fifth conductive film 600, the third conductive film 520, and the first part of the second conductive film 31a are connected to each other using the fourth opening and the third opening. As a result, it is possible to increase the thickness of the power source line 304. Therefore, by increasing the line width of the power supply line 304 and further increasing the thickness of the power supply line 304, it is possible to further reduce the resistance value of the power supply line 304. Therefore, it is possible to further reduce the time constant of the scanning signal line.

In the third embodiment, similarly to the first embodiment or the second embodiment, the fifth conductive film 600, the first part of the second conductive film 31a or the third conductive film 520 may be extended to the side on which the display unit 122 is provided along the X-direction, or may be extended to the opposite side on which the display unit 122 is provided along the X-direction, so as not to affect the display. By extending the fifth conductive film 600, the first part of the second conductive film 31a, or the third conductive film 520, it is possible to further thicken the line width of the fifth conductive film 600, the first part of the second conductive film 31a, or the third conductive film 520, it is possible to further reduce the time constant of the scanning signal line.

4. Fourth Embodiment

In the fourth embodiment, an example, in which the power supply line 304 is formed by the first conductive film, the second conductive film, the third conductive film, and the fifth conductive film will be described referring to FIGS. 18 and 19. Since the configuration other than the configuration in which the power supply line 304 is formed of the first conductive film, the second conductive film, the third conductive film, and the fifth conductive film is the same as the configuration described in the first embodiment to the third embodiment, the same or similar configuration as in FIGS. 1 to 16 will be omitted. An embodiment of the present invention shown in FIGS. 18 and 19 is an example and is not limited to the example shown in FIGS. 18 and 19.

Figure 18:
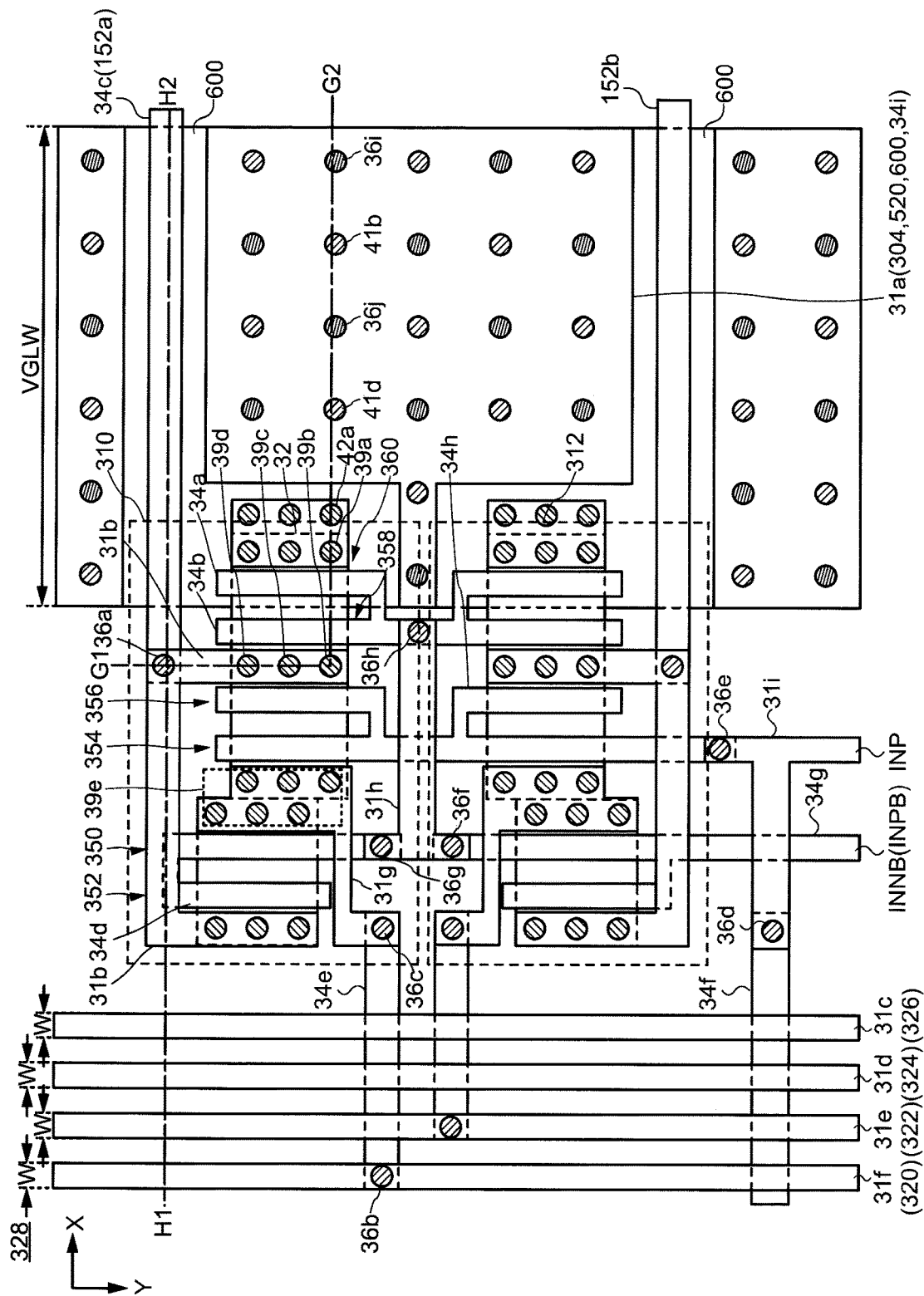
FIG. 18 is a diagram showing an exemplary layout of a part of a scanning line driving circuit according to an embodiment of the present invention.

FIG. 18 is a diagram showing an exemplary layout of a portion of the scanning signal line driving circuit 126 according to an embodiment of the present invention. FIG. 19 is a cross-sectional view showing a cross-section along G1-G2 of FIG. 18. Since a cross-sectional view showing a cross section along H1-H2 of FIG. 18 is similar to the cross-sectional view showing a cross section along F1-F2 shown in FIG. 17, a description thereof will be omitted.

Figure 19:
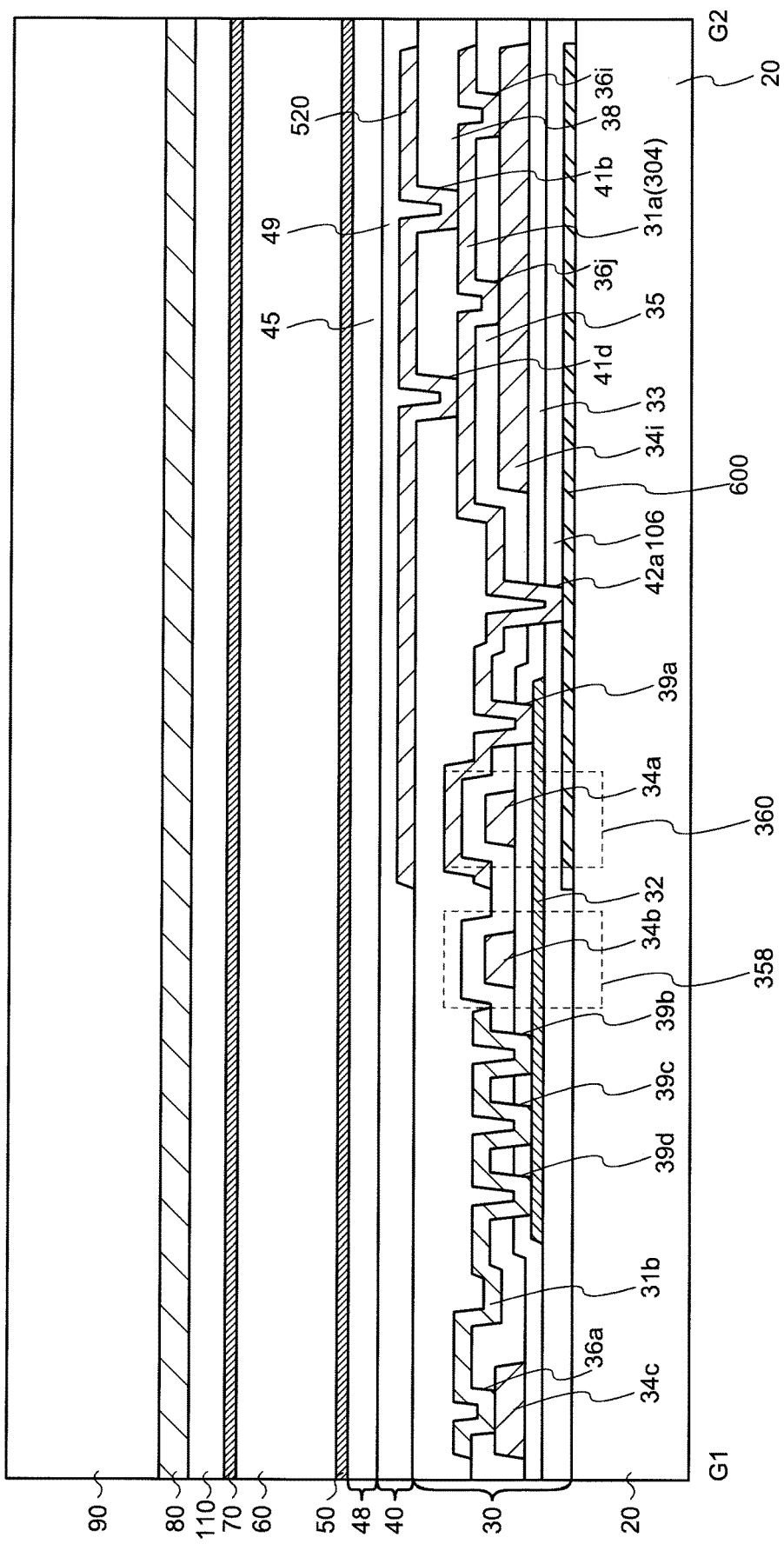
FIG. 19 is a cross-sectional view showing a cross-section along G1-G2 of FIG. 18.

As shown in FIGS. 18 and 19, an eighth part of a first conductive film 34i is provided on the gate insulating film 33. The fifth conductive film 600 is electrically connected to the first part of the second conductive film 31a via the fourth opening 42a. The eighth part of the first conductive film 34i is electrically connected to the first part of the second conductive film 31a via second openings 36i and 36j. The third conductive film 520 is electrically connected to the first part of the second conductive film 31a via the third openings 41b, and 41d. The fifth conductive film is provided between the first substrate 20 and the first conductive film. The first conductive film is provided between the fifth conductive film and the second conductive film. The second conductive film is provided between the first conductive film and the third conductive film. The third conductive film is provided between the second conductive film and the second substrate 90.

In the fourth embodiment, the fifth conductive film 600, the eighth part of the first conductive film 34i, the first part of the second conductive film 31a, and the third conductive film 520 are stacking. The fifth conductive film 600, the eighth part of the first conductive film 34i, the first part of the second conductive film 31a, and the third conductive film 520 are connected to each other by using the second opening, the third opening, and the fourth opening. As a result, it is possible to increase the thickness of the power supply line 304. Therefore, by increasing the line width of the power supply line 304 and further increasing the thickness of the power supply line 304, it is possible to further reduce the resistance value of the power supply line 304. Therefore, it is possible to further reduce the time constant of the scanning signal line.

Also in the fourth embodiment, similarly to the first embodiment to the third embodiment, the fifth conductive film 600, the eighth part of the first conductive film 34i, the first part of the second conductive film 31a and the third conductive film 520 may be extended to the side on which the display unit 122 is provided along the X-direction, or may be extended to the opposite side on which the display unit 122 is provided along the X-direction, so as not to affect the display. By extending the fifth conductive film 600, the eighth part of the first conductive film 34i, the first part of the second conductive film 31a and the third conductive film 520, it is possible to further thicken the line width of the fifth conductive film 600, the eighth part of the first conductive film 34i, the first part of the second conductive film 31a and the third conductive film 520, it is possible to further reduce the time constant of the scanning signal line.

5. Fifth Embodiment

In the fifth embodiment, an example in which the power supply line 304 is formed of the first conductive film, the second conductive film, and the third conductive film, and the scanning signal line is formed of the fifth conductive film will be described referring to FIGS. 20 to 22. Since the configuration other than the configuration in which the power supply line 304 is formed of the first conductive film, the second conductive film, and the third conductive film, and the scanning signal line is formed of the fifth conductive film is the same as the configuration described in the first embodiment to the fourth embodiment, the same or similar configuration as in FIGS. 1 to 17 will be omitted. One embodiment of the present invention shown in FIGS. 20 to 22 is an example and is not limited to the example shown in FIGS. 20 to 22.

Figure 20:
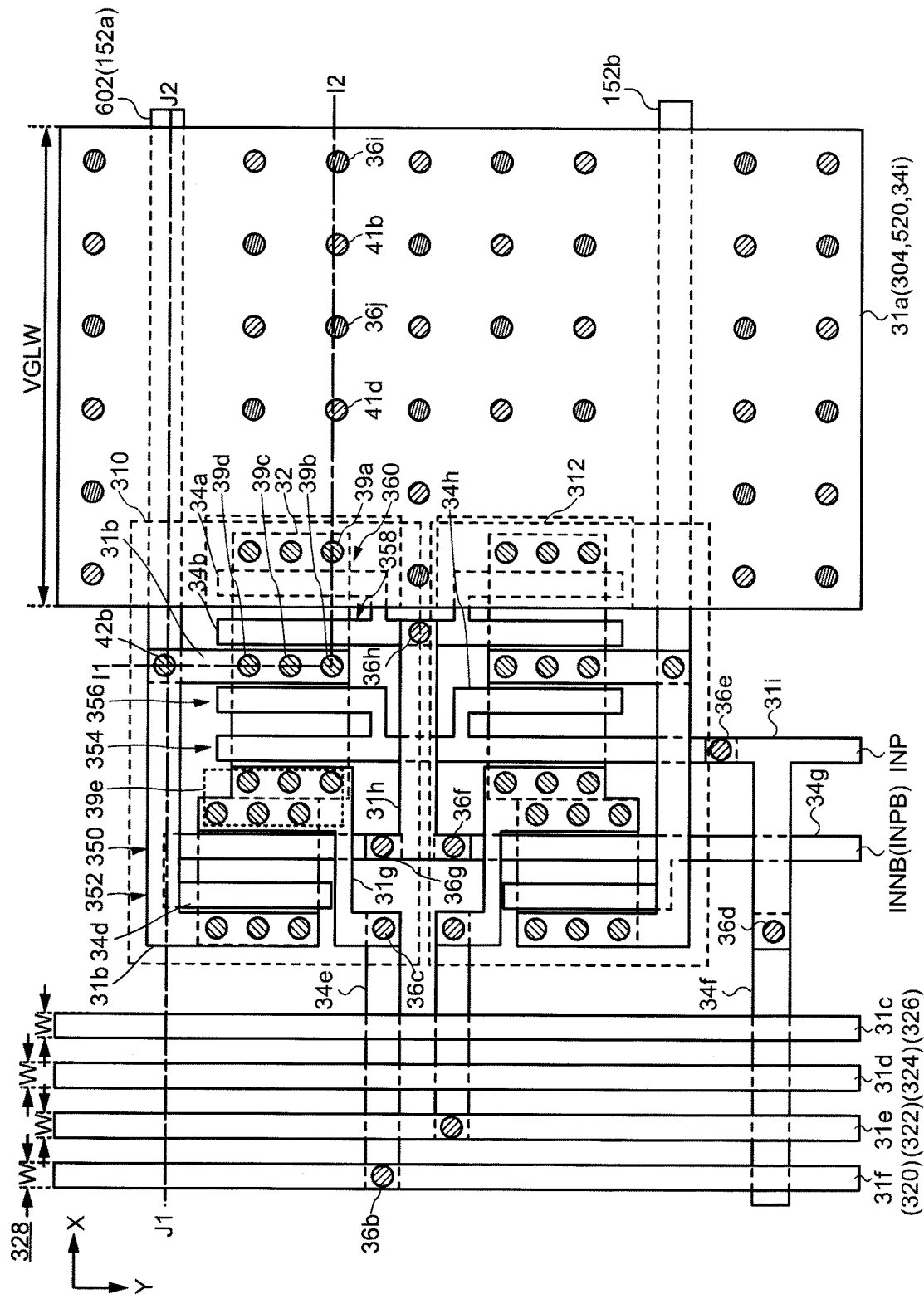
FIG. 20 is a diagram showing an exemplary layout of a part of a scanning line driving circuit according to an embodiment of the present invention.

FIG. 20 is a diagram showing an exemplary layout of a portion of the scanning signal line driving circuit 126 according to an embodiment of the present invention. FIG. 21 is a cross-sectional view showing a cross-section along I1-I2 of FIG. 20. FIG. 22 is a cross-sectional view showing a cross-section along J1-J2 of FIG. 20.

Figure 21:
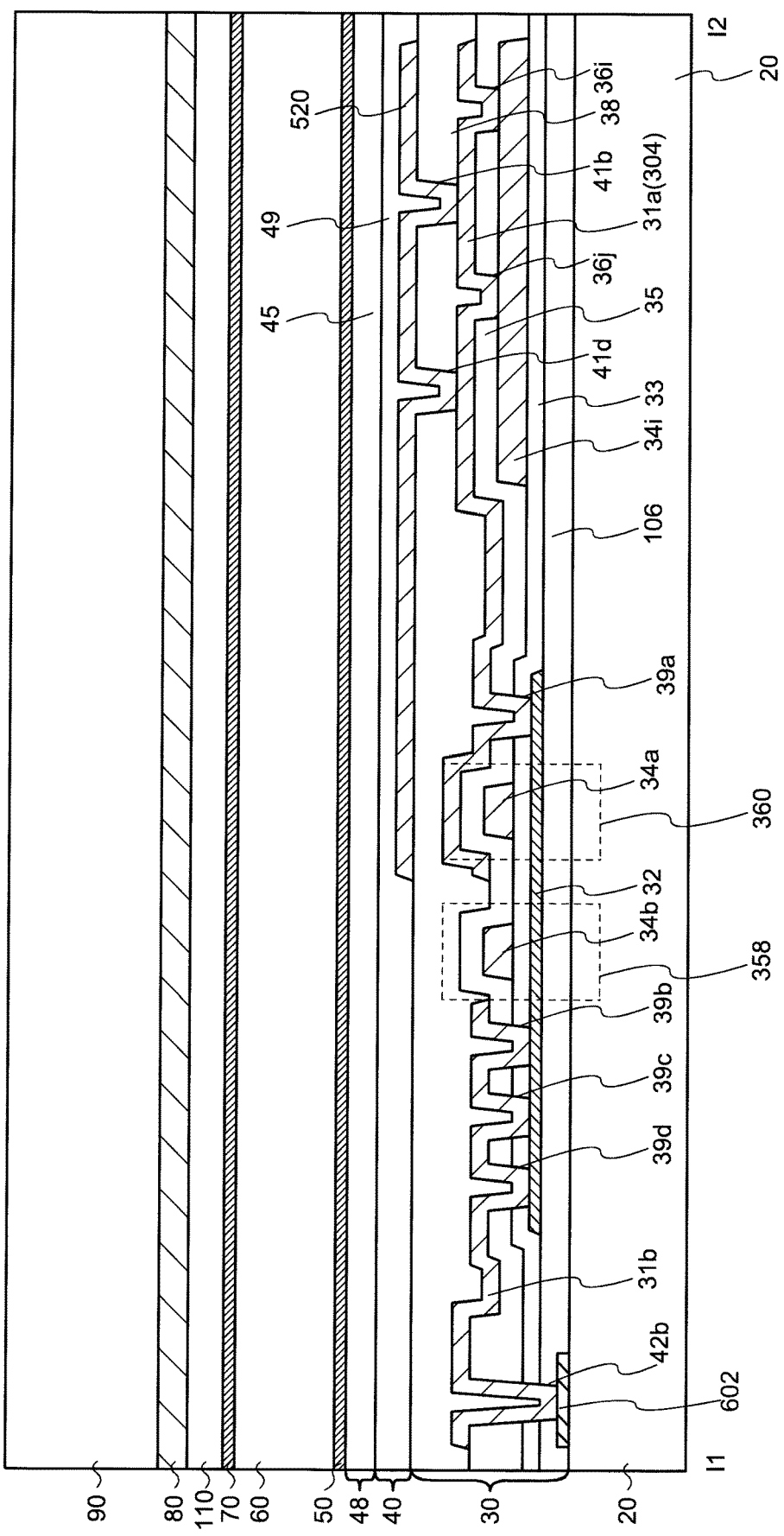
FIG. 21 is a cross-sectional view showing a cross-section along I1-I2 of FIG. 20.
Figure 22:
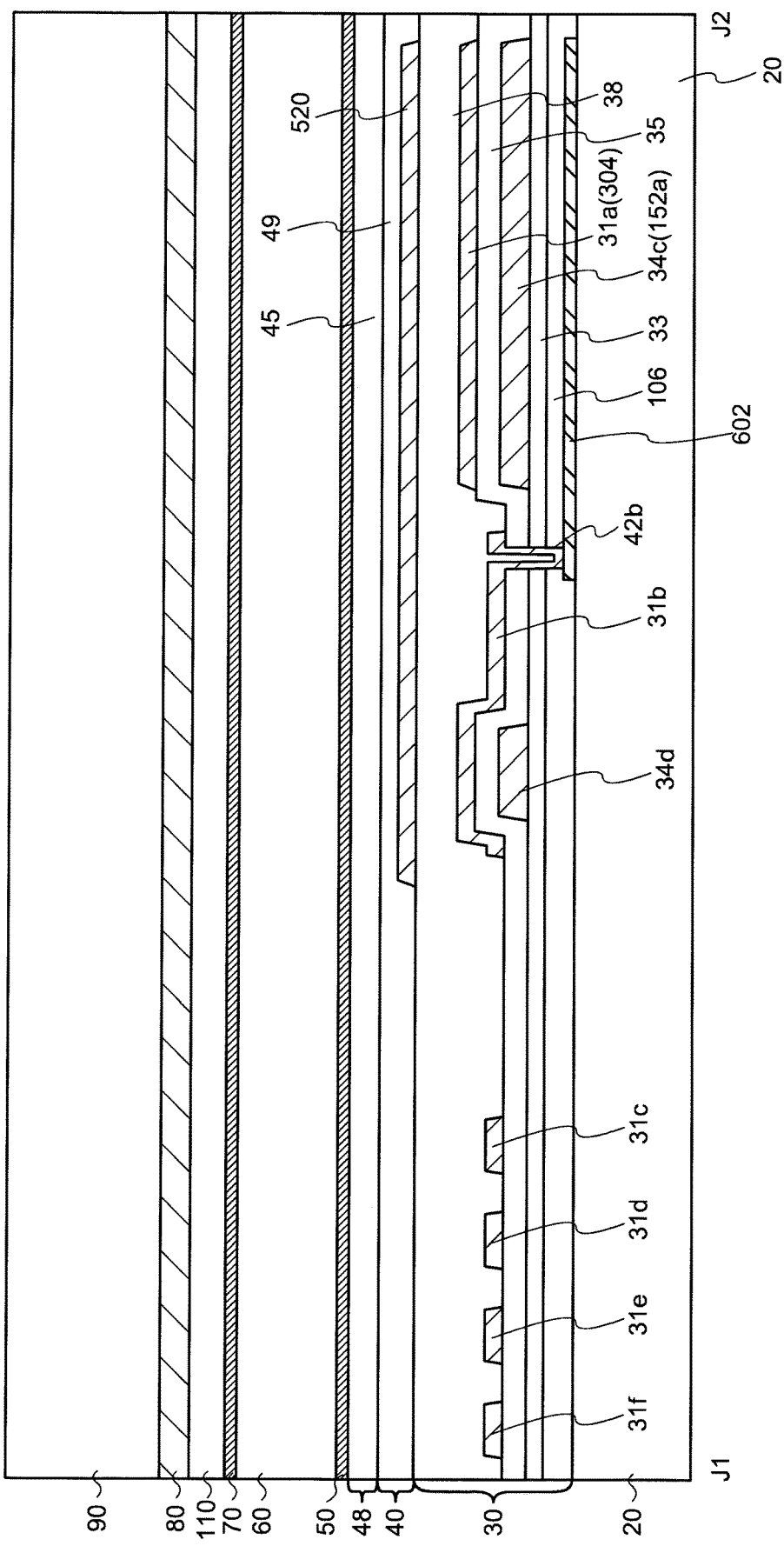
FIG. 22 is a cross-sectional view showing a cross-section along J1-J2 of FIG. 20.

As shown in FIGS. 20-22, the scanning signal line 152a and the scanning signal line 152b are formed in the fifth conductive film. A fifth conductive film 602 is provided on the first substrate 20. The fifth conductive film 602 is electrically connected to the second part of the second conductive film 31b via the fourth opening 42b.

The eighth part of the first conductive film 34i is provided on the gate insulating film 33. The eighth part of the first conductive film 34*i* is electrically connected to the first part of the second conductive film 31*a* via the second opening 36*i* and the second opening 36*j*. The third conductive film 520 is electrically connected to the first part of the second conductive film 31*a* via the third opening 41*b*, and the third opening 41*d*. The fifth conductive film is provided between the first substrate 20 and the first conductive film. The first conductive film is provided between the fifth conductive film and the second conductive film. The second conductive film is provided between the first conductive film and the third conductive film. The third conductive film is provided between the second conductive film and the second substrate 90.

In the fifth embodiment, the eighth part of the first conductive film 34*i*, the first part of the second conductive film 31*a* and the third conductive film 520 are attacking. The eighth part of the first conductive film 34*i*, the first part of the second conductive film 31*a* and the third conductive film 520 are connected to each other using the second opening, and the third opening. As a result, it is possible to increase the thickness of the power source line 304. Therefore, by increasing the line width of the power supply line 304 and further increasing the thickness of the power supply line 304, it is possible to further reduce the resistance value of the power supply line 304. Therefore, it is possible to further reduce the time constant of the scanning signal line.

Also in the fifth embodiment, similarly to the first embodiment to the fourth embodiment, the eighth part of the first conductive film 34*i*, the first part of the second conductive film 31*a* and the third conductive film 520 may be extended to the side on which the display unit 122 is provided along the X-direction, or may be extended to the opposite side on which the display unit 122 is provided along the X-direction, so as not to affect the display. By extending the eighth part of the first conductive film 34*i*, the first part of the second conductive film 31*a* and the third conductive film 520, it is possible to further thicken the line width of the eighth part of the first conductive film 34*i*, the first part of the second conductive film 31*a* and the third conductive film 520, it is possible to further reduce the time constant of the scanning signal line.

6. Sixth Embodiment

In the sixth embodiment, an exemplary layout of the peripheral part 136 of the power supply line 304 will be described referring to FIG. 23. The same or similar components as those of FIGS. 1 to 22 will be omitted. One embodiment of the present invention shown in FIG. 23 is an example and is not limited to the example shown in FIG. 23.

Figure 23:
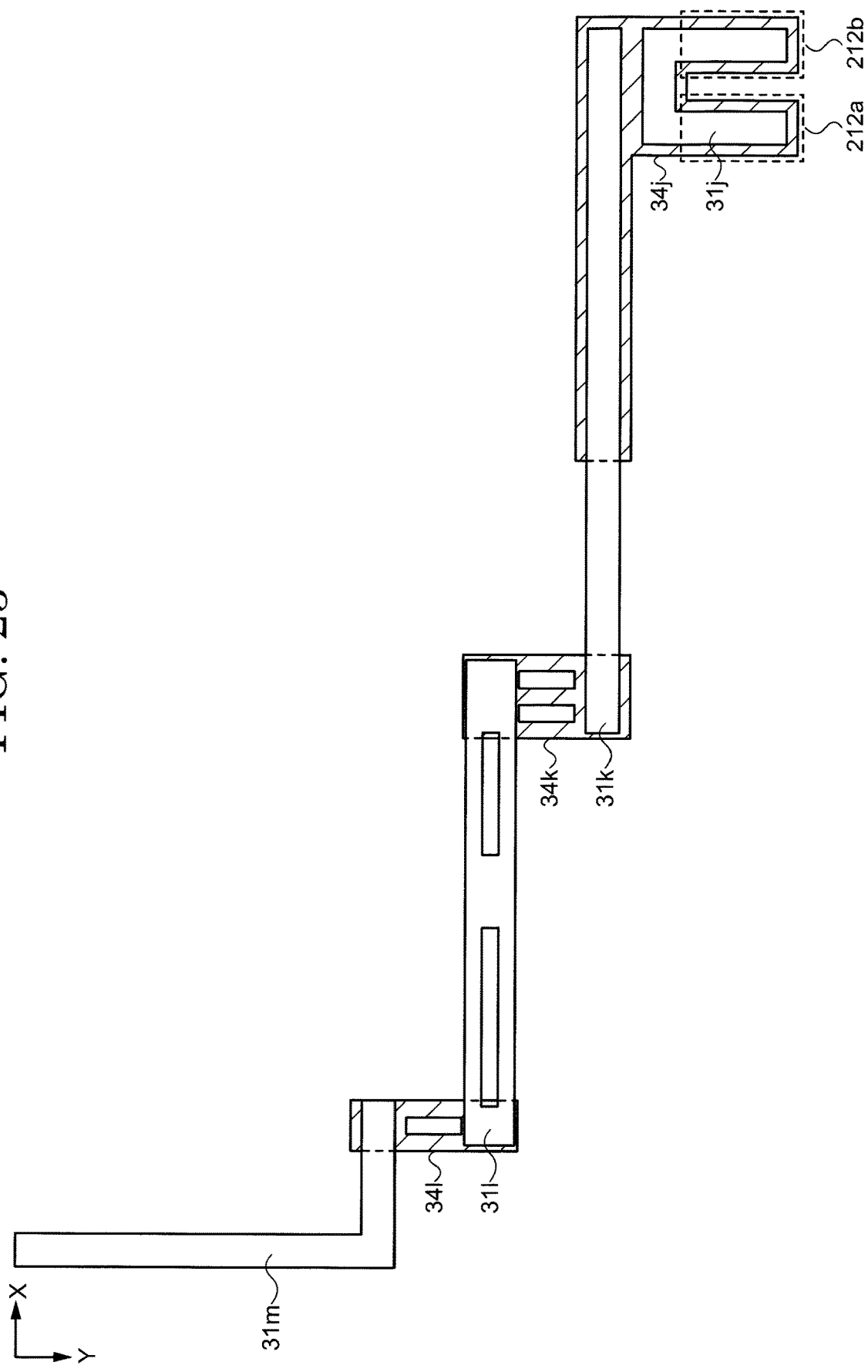
FIG. 23 is a diagram showing an exemplary power supply line layout according to an embodiment of the present invention.

FIG. 23 is a diagram showing an exemplary layout of the peripheral part 136 of the power supply line 304 according to an embodiment of the present invention.

As shown in FIG. 23, for example, in the peripheral part 136, the power supply line 304 is formed by electrically connecting a tenth part of a second conductive film 31*j*, a ninth part of a first conductive film 34*j*, an eleventh part of a second conductive film 31*k*, a tenth part of a first conductive film 34*k*, a twelfth part of a second conductive film 31*l*, an eleventh part of a first conductive film 34*l*, and a thirteenth part of a second conductive film 31*m* provided in a first terminal part 212*a* and a first terminal part 212*b*. Finally, the thirteenth part of the second conductive film 31*m* and the power supply line 304 (the first part of the second conductive film 31*a*) are electrically connected. Although not shown, in a region where the first conductive film and the second conductive film is stacked, the first conductive film and the second conductive film are electrically connected to each other using the second opening.

In a region where the ninth part of the first conductive film 34*j* and the eleventh part of the second conductive film 31*k* are stacked, the line widths of the ninth part of the first conductive film 34*j* and the eleventh part of the second conductive film 31*k* are, for example, 45 μm or more and 50 μm or less. In a region where the eleventh part of the second conductive film 31*k* is provided in a single layer, the line width of the eleventh part of the second conductive film 31*k* is, for example, 25 μm or more and 57 μm or less. In regions where the eleventh part of the second conductive film 31*k* and the tenth part of the first conductive film 34*k* are stacked, where the tenth part of the first conductive film 34*k* is provided in a single layer, and where the tenth part of the first conductive film 34*k* and the eleventh part of the first conductive film 34*l* are stacked, the tenth part of the first conductive film 34*k* is composed of three wirings. Each of the line widths of the three wirings, for example, is 20 μm. In regions where the twelfth part of the second conductive film 31*l* and the tenth part of the first conductive film 34*k* are stacked, where the twelfth part of the second conductive film 31*l* is provided in a single layer, and where the twelfth part of the second conductive film 31*l* and the eleventh part of the first conductive film 34*l* are stacked, the twelfth part of the second conductive film 31*l* is composed of a wiring bridging two wirings and two wirings. The line widths of the two wirings are, for example, 13.75 μm. In regions where the thirteenth part of the second conductive film 31*m* and the eleventh part of the first conductive film 34*l* are stacked, and where the thirteenth part of the second conductive film 31*m* is provided in a single layer, the line width of the thirteenth part of the second conductive film 31*m*, for example, is 20 μm.

In the example of the layout shown in FIG. 23, an example is shown in which each conductive film has a rectangular shape, but the layout is not limited to this example. Each conductive film may be a conductive film having an arcuate portion. Each conductive film has an arc-shaped part, so the length can be shorter than the conductive film composed of a rectangular shape. Each region may be stacked the third conductive film or the fifth conductive film in addition to the first conductive film and the second conductive film, in a range of the peripheral portion 136, and each conductive film may be electrically connected using the first opening, the second opening, the third opening, and the fourth opening, so as not to affect the display 122.

By the configuration described above, it is possible to reduce the resistance value of the peripheral portion of the power supply line. As a consequence, it is possible to further reduce the time constant of the scanning signal line.

7. Seventh Embodiment

Figure 24:
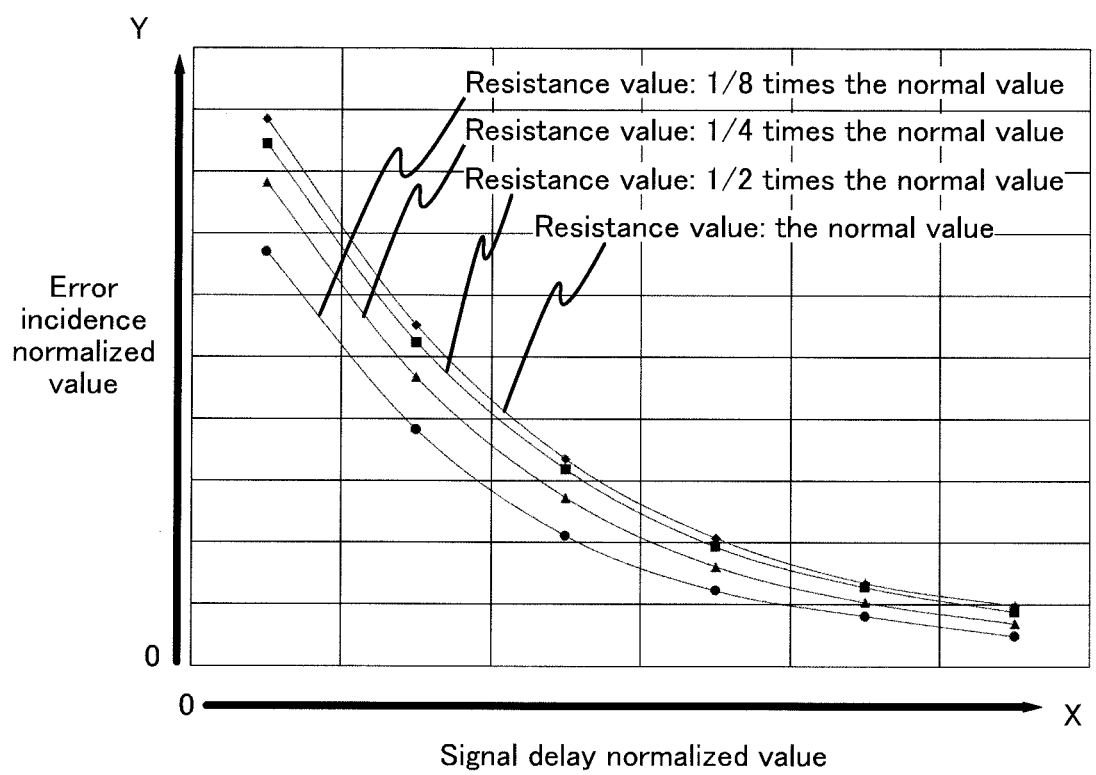
FIG. 24 is a diagram showing an exemplary circuit-simulation result of a display device according to an embodiment of the present invention.

In the seventh embodiment, an exemplary circuit-simulation result of the power supply line and the scanning signal line will be described referring to FIG. 24. The same or similar configurations as those of FIGS. 1 to 23 will be omitted. FIG. 24 is a diagram showing an exemplary result of the circuit-simulation of the display device according to an embodiment of the present invention.

In FIG. 24, the Y-axis is an error rate normalized value, and the X-axis is a signal delay normalized value of the scanning signal line. The error occurrence rate normalized value is a value obtained by normalizing the probability that a failure occurs in the display unit, and the signal delay normalized value is a value obtained by normalizing the signal delay of the scanning signal supplied to the scanning signal line. In FIG. 24, the simulated conditions are four conditions in which the resistance value of the power supply line is set to the normal value (equal magnification), half of the normal value (½), ¼ of the normal value, and ⅛ of the normal value. From FIG. 24, it can be seen that when the error occurrence rate normalized value is the same in each condition, the smaller resistance value, the smaller the signal delay normalized value. From FIG. 24, it can be seen that when the signal delay normalization value is the same in every condition, the smaller resistance value, the smaller the error occurrence rate normalized value.

In an embodiment of the present invention, when the conventional line width is 20 μm and the line width VGLW is 80 μm, it corresponds to a simulated result of ¼ of the normal value.

That is, the smaller resistance, the smaller the error occurrence rate and the smaller signal delay. Therefore, in the display device according to an embodiment of the present invention, by reducing the resistance value of the power supply line, generation of crosstalk is suppressed, it is possible to suppress a decrease in the display quality.

8. Eighth Embodiment

Figure 25:
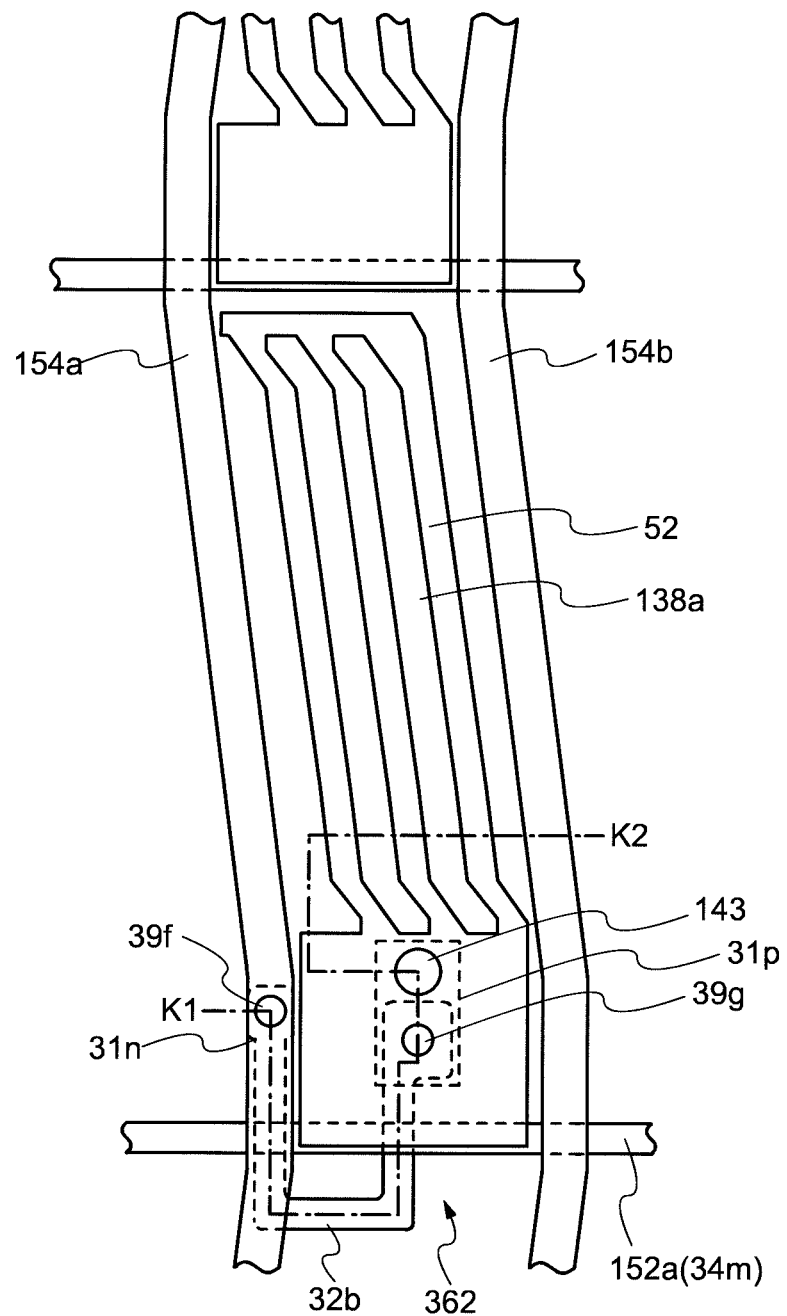
FIG. 25 is a diagram showing an example of a pixel layout according to an embodiment of the present invention.
Figure 26:
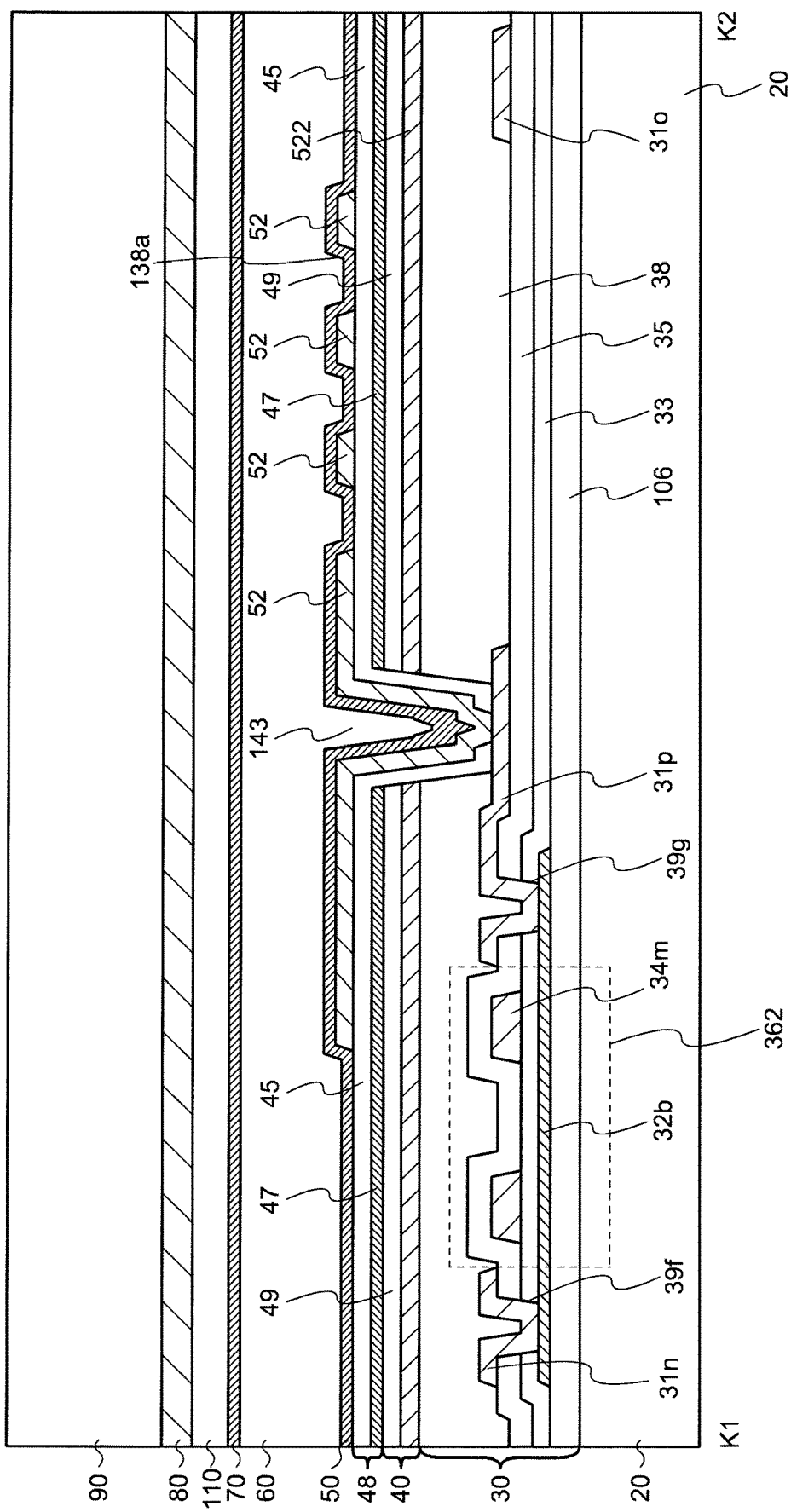
FIG. 26 is a cross-sectional view showing a cross-section along K1-K2 of FIG. 25.

In the eighth embodiment, an example of a pixel layout of the display device according to an embodiment of the present invention will be described. FIG. 25 shows an example of the pixel layout of the display device according to an embodiment of the present invention. FIG. 26 is a cross-sectional view showing a cross-section along K1-K2 of FIG. 25. One embodiment of the invention shown in FIGS. 25 and 26 is an example and not limited to the example shown in FIGS. 25 and 26.

The pixel PX has a configuration applicable to an FFS (Fringe Field Switching) mode, which is one type of an IPS (In Plane Switching) mode. The display device 10 having the pixel PX mainly utilizes a transverse electric field formed between the common electrode 530 (the fourth conductive film 47) included in the pixel electrode 52 and the electrode layer 48 (e.g., an electric field substantially parallel to the main surface of the substrate of the fringe electric field) to control the orientation of liquid crystal molecules constituting the liquid crystal layer 60.

As shown in FIG. 25, the pixel PX includes a transistor 362, the video signal line 154a, the scanning signal line 152a, and the pixel electrode 52. The transistor 362 includes a semiconductor film 32b, a gate electrode 34m, a source and drain electrode 31p, a source and drain electrode 31n, a first opening 39f and a first opening 39g. The source and drain electrode 31p, the source and drain electrode 31n are electrically connected to the semiconductor film 32b via the first opening 39f and the first opening 39g. The pixel electrode 52 is electrically connected to the source and drain electrode 31p via a fifth opening 143. By the source and drain electrode 31p, the wiring 522, and the planarization film 38 to be described later, a capacitive element is formed. The capacitive element is formed by the wiring 522, the common electrode 530 (the fourth conductive film 47), and the organic film 49, which will be described later. By the pixel electrode 52, the common electrode 530 (the fourth conductive film 47), and the organic insulating film 45 to be described later, the capacitive element is formed. The source and drain electrode 31n and the video signal line 154a are electrically connected. The video signal line 154b is a video signal line of neighboring pixels. The gate electrode 34m and the scanning signal line 152a are electrically connected to each other. The wiring 522 serves to provide the common voltage to all the pixels PX included in the display unit 122 when displaying an image on the display device 10. By applying a voltage to each of the pixel electrode 52 and the wiring 522, an electric field is generated in the pixel electrode 52 and the common electrode 530 (the fourth conductive film 47) connected to the wiring 522. As the electric field is generated, the liquid crystal element included in the liquid crystal layer 60 is controlled, and the display device 10 is capable of displaying an image. The shape of the semiconductor film 32b, the materials forming the semiconductor film 32b, and the configuration of the transistor 362 are not limited to the configuration shown in FIG. 9. Without departing from an embodiment of the present invention, depending on the specifications and applications, the shape of the semiconductor film 32b, the materials forming the semiconductor film 32b, and the configuration of the transistor 362 may be considered as appropriate. The gate electrode 34m is the second conductive film, the source and drain electrode 31p and the source and drain electrode 31n are the second conductive film.

As shown in FIG. 26, the fifth opening 143 is provided for electrically connecting the pixel electrode 52 and the source and drain electrode 31p (the second conductive film). The fifth opening 143 opens the organic insulating film 45, the fourth conductive film 47, the organic film 49, and the wiring 522.

The pixel electrode 52 is provided to contact the surface of the source and drain electrode 31p (the second conductive film), a portion of the side surface and the surface of the organic insulating film 45. The first orientation film 50 is provided to cover the pixel electrode 52. The pixel electrode 52 is connected to the source and drain electrode 31p (the second conductive film). In the embodiment shown in FIG. 26, the configuration of the pixel electrode 52 is a single layer structure but may be the stacked structure. For the stacked structure, the material forming the pixel electrode 52 may be, for example, stacking of two ITOs (Indium Tin Oxide) having different refractive indices or transmittances, stacking of two IZOs (Indium Zinc Oxide) having different refractive indices or transmittances, or stacking of two light transmittance materials having different refractive indices or transmittances.

Each of the embodiments described above as an embodiment of the present invention can be appropriately combined and implemented as long as they do not contradict each other.

In the present specification, a liquid crystal display device has been described as an example. The present invention can be applied from small and medium to large size without any particular limitation.

Even if it is another working effects which differ from the working effect brought about by the mode of each above-mentioned embodiment, what is clear from the description in this description, or what can be easily predicted by the person skilled in the art is naturally understood to be brought about by the present invention.

What is claimed is:
1. A display device comprising:
   a plurality of pixels arranged on a first direction and a second direction intersecting the first direction,
   a scanning signal line connected to at least one pixel of the plurality of pixels, and
   a scanning signal line driving circuit connected to the scanning signal line;

wherein the scanning signal line driving circuit includes a switch for outputting a signal to the scanning signal line, a first power supply line for providing a first voltage to the switch, and a second power supply line for providing a second voltage smaller than the first voltage to the switch;

wherein the switch is provided between the first power supply line and the second power supply line, and a line width of the second power supply line is 4 times the line width of the first power supply line or more and 40 times the line width of the first power supply line or less.

2. The display device according to claim 1, wherein the second power supply line is provided in a layer different from the scanning signal line and configured by a first conductive film provided in the same layer as the first power supply line.

3. The display device according to claim 2, further comprising:
a planarization film covering the first power supply line and the second power supply lines.

4. The display device according to claim 1, wherein the second power supply line is provided in a layer different from the scanning signal line and configured by a first conductive film provided in the same layer as the first power supply line and a second conductive film overlapping with the first conductive film, electrically connected to the first conductive film, and provided in an opposite side to the layer provided with the scanning signal line relative to the first conductive film.

5. The display device according to claim 4, further comprising:
a planarization film provided between the first conductive film and the second conductive film, and covering the first conductive film.

6. The display device according to claim 1, wherein the second power supply line is configured by a first conductive film provided in the same layer as the first power supply line, a second conductive film overlapping with the first conductive film and electrically connected to the first conductive film, a fourth conductive film overlapping with the first conductive film and the second conductive film and electrically connected to the first conductive film and the second conductive film, and provided in an opposite side to the layer provided with the second conductive film relative to the first conductive film; and the scanning signal line is overlapping with the first conductive film and provided in an opposite side to the layer provided with the second conductive film relative to the first conductive film, and provided in the same layer as a third conductive film provided between the first conductive film and the fourth conductive film.

7. The display device according to claim 6, further comprising:
a planarization film provided between the first conductive film and the second conductive film, and covering the first conductive film.

8. The display device according to claim 1, wherein the second power supply line comprises a first conductive film provided in the same layer as the first power supply line, a second conductive film overlapping with the first conductive film and electrically connected to the first conductive film, a third conductive film overlapping with the first conductive film and the second conductive film and electrically connected to the first conductive film and the second conductive film, provided in an opposite side to the layer provided with the second conductive film relative to the first conductive film, and provided in the same layer as the scanning signal line, and a fourth conductive film overlapping with the first conductive film, the second conductive film, and the third conductive film, electrically connected to the first conductive film, the second conductive film, and the third conductive film, provided in an opposite side to the layer provided with the first conductive film relative to the third conductive film.

9. The display device according to claim 8, further comprising:
a planarization film provided between the first conductive film and the second conductive film, and covering the first conductive film.

10. The display device according to claim 1, wherein the second power supply line is configured by a first conductive film provided in the same layer as the first power supply line, a second conductive film overlapping with the first conductive film and electrically connected to the first conductive film, a third conductive film overlapping with the first conductive film and the second conductive film and electrically connected to the first conductive film and the second conductive film, provided in an opposite side to the layer provided with the second conductive film relative to the first conductive film, and the scanning signal line is overlapping with the second conductive film and the third conductive film and provided in the same layer as a fourth conductive film provided in an opposite side to the layer provided with the second conductive film relative to the first conductive film.

11. The display device according to claim 10, further comprising:
a planarization film provided between the first conductive film and the second conductive film, and covering the first conductive film.

* * * * *